United States Patent [19]

Horie et al.

[11] Patent Number: 5,637,428
[45] Date of Patent: Jun. 10, 1997

[54] LITHOGRAPHIC PRINTING PLATE

[75] Inventors: Seiji Horie; Syunichi Kondo, both of Shizuoka, Japan

[73] Assignee: Fuji Photo Film Co., Ltd., Kanagawa, Japan

[21] Appl. No.: 526,980

[22] Filed: Sep. 12, 1995

[30] Foreign Application Priority Data

Sep. 12, 1994 [JP] Japan .................................. 6-217694

[51] Int. Cl.$^6$ .................................................. G03G 13/26
[52] U.S. Cl. ........................... 430/49; 430/18; 430/302
[58] Field of Search ............................ 430/49, 302, 326, 430/18

[56] References Cited

U.S. PATENT DOCUMENTS

| 4,916,046 | 4/1990 | Doessel ............................. 430/326 |
| 5,364,738 | 11/1994 | Kondo et al. ........................ 430/326 |
| 5,380,612 | 1/1995 | Kojima et al. ........................ 430/49 |

*Primary Examiner*—Christopher D. Rodee
*Attorney, Agent, or Firm*—Sughrue, Mion, Zinn, Macpeak & Seas

[57] ABSTRACT

A lithographic printing plate formed by charging a printing original plate which comprises an electroconductive support and provided thereon at least one photosensitive layer containing a photoconductive compound and a positive working photosensitive composition, imagewise exposing the printing original plate to form a latent image, forming a toner image with a liquid developer, exposing the whole surface of the positive working photosensitive composition with an active light, and removing the photosensitive layer in a non-image area other than the toner image area with an eluting solution comprising an alkaline solvent is disclosed. The positive working photosensitive composition contains (a) a compound having at least two enol ether groups represented by formula (I):

$$(R^2)(R^1)C{=}C(R^3){-}O{-} \qquad (I)$$

wherein $R^1$, $R^2$ and $R^3$ are defined in the disclosure, (b) a linear polymer having an acid group and/or hydroxy group, and (c) a compound which generates an acid by decomposition upon irradiation with the active light, and wherein the component (a) and the component (b) are thermally crosslinked during or after formation of the photosensitive layer. The lithographic printing plate precursor according to the present invention has a high sensitivity to a semiconductor laser light source, a shortened time for the whole surface exposure and an enlarged elusion latitude, and provides a lithographic printing plate having good printing image reproducibility and printing durability.

7 Claims, No Drawings

LITHOGRAPHIC PRINTING PLATE

FIELD OF THE INVENTION

This invention relates to a plate-making process for forming a printing plate using a printing original plate comprising an electroconductive support having a hydrophilic surface and proved thereon at least one photosensitive layer containing a photoconductive compound and a positive working photosensitive composition in the same layer or different layers provided. More specifically, the present invention relates to a lithographic printing plate prepared by forming a toner image on the photosensitive layer in an electrophotographic system, exposing the whole surface of the layer, and removing the photosensitive layer in a non-image area other than the toner image area with an eluting solution.

BACKGROUND OF THE INVENTION

At present, PS (presensitized) plates using a positive working photosensitive agent comprising mainly a quinonediazide compound and a phenol resin and a negative working photosensitive agent comprising mainly an acrylic monomer or a prepolymer thereof are practically used as lithographic printing plates. However, due to their low sensitivity, a platemaking is carried out by contact exposure using a film original to which an image has previously been recorded.

On the other hand, in recent years, with the progress in the computer image processing and the data saving of large capacity as well as the data communication technique, an electronic editing system has been put into practical use where input of originals, correction, editing, layout and page-making are operated throughout by a computer, and the data are instantly available to output at a terminal plotter through a high-speed communication network and a communication satellite even at a far place. In particular, the electronic editing system is highly demanded in the newspaper printing field where quickness is always required. Also, at present, in the field where originals are saved in the form of films and printing plates are duplicated from the films according to need, the original will be saved as digital data in recording media of large capacity such as optical disks, with the progress of such recording media.

However, the direct platemaking in which a printing plate is prepared directly from the output of terminal plotters has not yet been practically used, and the output is made with silver salt photographic films even where the electronic editing system is operated, and practically a printing plate is prepared by contact exposure from the photographic film to a PS plate. One reason therefor is that it is difficult to develop a direct-type printing plate which having a sensitivity sufficiently high to prepare a printing plate with a light source of the output plotter (for example, a He-Ne laser or a semiconductor laser) within a practically acceptable period of time.

It is considered that an electrophotographic photosensitive material would be a photosensitive material having a high sensitivity capable of providing a direct-type printing plate. As a method for preparing a printing plate using the electrophotography, a method comprising forming a toner image and eluting a photoconductive layer in the non-image area has been known. Electrophotographic lithographic printing plates using such a method are described, for example, in JP-B-37-17162, JP-B-38-6961, JP-B-38-7758, JP-B-41-2426, JP-B-46-39405, JP-A-50-19509, JP-A-50-19510, JP-A-52-2437, JP-A-54-145538, JP-A-54-134632, JP-A-55-105254, JP-A-55-153948, JP-A-55-161250, JP-A-57-147656 and JP-A-57-161863. (The terms "JP-A" and "JP-B" as used herein mean an "unexamined published Japanese patent application" and an "examined Japanese patent publication", respectively.)

In the above-described method, the non-image area of the electrophotographic photosensitive material must be removed with an eluting solution to expose a hydrophilic surface. However, the method has a defect in that the eluting solution often permeates into a photoconductive layer beneath the image area, i.e., the area where a toner image has been formed, and removal of the image area, i.e., a so-called "side-etching" occurs whereby highlight portions or fine lines which must be retained are removed and, hence, the image reproducibility is decreased.

To the above defect, a lithographic printing plate using a photoconductive compound and a photosensitive material in its photosensitive layer for the purpose of providing compatibility between the high-sensitivity of the electrophotographic system and good printing image reproducibility of the positive working photosensitive layer has been proposed, for example, in JP-A-57-90648, JP-A-58-150953, JP-A-58-162960 and JP-A-58-162961. The positive working photosensitive layer disclosed therein uses an o-quinonediazide compound as a photopolymer which is a photosensitive material. For this reason, the photoconductive compound functions as a filter to the photopolymer thereby reducing the sensitivity at the time of the whole surface exposure and, hence, there is a disadvantage in that the time for the whole surface exposure must be prolonged markedly. Also, the printing plate using a photoconductive compound such as a pigment is desired to have a high eluting latitude at the time of elution of the non-image area, but the above-described conventional technique is directed to a method for forming a printing image by difference in solubility caused by light-exposure, the difference in the solubility between the non-image area to be removed with the eluting solution and the image area to be retained is not necessarily high, and, therefore, the conventional technique is not satisfactory in the eluting latitude.

As described above, the conventional technique has problems in that productivity can not be improved since the exposing time at the time of the whole surface exposure is required to be prolonged or the eluting latitude is not necessarily satisfactory.

SUMMARY OF THE INVENTION

An object of the present invention is to solve the problems in the conventional technique and to provide a lithographic printing plate which makes it possible to shorten an exposing time during the whole surface exposure and to enlarge an eluting latitude at the time of the elution.

Another object of the present invention to provide a lithographic printing plate which is free from printing stains and which is excellent in the printing durability.

A still another object of the present invention is to provide a lithographic printing plate which is excellent in image characteristics.

A further object of the present invention is to provide a lithographic printing plate having a high sensitivity suitable for image formation by a scanning exposure with, for example, a laser.

As a result of extensive studies for achieving the above objects, the present inventors found that the above objects can be achieved by a lithographic printing plate formed by charging a printing original plate which comprises an electroconductive support having a hydrophilic surface and provided thereon at least one photosensitive layer containing a photoconductive compound and a positive working photosensitive composition in the same layer or different layers, imagewise exposing the printing original plate to form a latent image, forming a toner image with a liquid development, exposing the whole surface of the positive working photosensitive composition with an active light, and removing the photosensitive layer in a non-image area other than the toner image area with an eluting solution comprising an alkaline solvent, wherein the positive working photosensitive composition contains:

(a) a compound having at least two enol ether groups represented by formula (I):

$$(R^2)(R^1)C=C(R^3)-O-\quad\quad\quad (I)$$

wherein $R^1$, $R^2$ and $R^3$, which may be the same or different, each represents hydrogen atom, an alkyl group or an aryl group and any two of $R^1$, $R^2$ and $R^3$ may be bonded together to form a saturated or an olefinically unsaturated ring, (b) a linear polymer having an acid group and/or hydroxy group, and (c) a compound which generates an acid by decomposition upon irradiation with the active light, and wherein the component (a) and the component (b) are thermally crosslinked during or after the formation of the photosensitive layer.

DETAILED DESCRIPTION OF THE INVENTION

The lithographic printing plate according to the present invention can be prepared by forming a toner image by a conventional method, fixing or without fixing, effecting a whole surface exposure, and eluting a photosensitive layer in the non-image area other than the image area.

More specifically, a printing original plate is substantially uniformly charged in a dark place and then a static latent image is formed by an imagewise exposure. The method for exposure includes a scanning exposure with a semiconductor laser or a He-Ne laser, a reflection imagewise exposure using as a light source of a xenon lamp, a tungsten lamp or a fluorescent lamp, and a contact exposure through a transparent positive image film. Then, the static latent image formed above is developed with a toner. The developing method can be various conventional methods, for example, a cascade development, a magnetic brush development, a powder-cloud development and a liquid development. Of these development methods, the liquid development is useful for forming fine images and, therefore, is suitable for preparing a printing plate. Also, any of a positive development in which a toner is adhered to the non-image area or a reverse development in which a toner is adhered to the exposed area can be used.

After forming the toner image by the liquid development, the positive working photosensitive composition is subjected to the whole surface exposure with an active light, and the photosensitive layer in the non-image area other than the toner image area is removed with an eluting solution comprising an alkaline solvent to produce a lithographic printing plate.

Since the toner image formed by the liquid development functions as a mask at the time of the whole surface exposure, the toner image may be or may not be fixed. If it is fixed, a conventional fixing method, for example, a heat-fixing, pressure-fixing or a solvent-fixing can be used.

After elution, if desired, a step for washing with water, a gumming step, a drying step, a plate-inspection step which recognizes patterns provided with a CCD sensor, a bender and punching step which are capable of fabricating the printing plate into a predetermined shape, and a plate accumulating step can be performed.

The positive working photosensitive composition used in the present invention is described hereinafter.

The positive working photosensitive composition contains:

(a) a compound having at least two enol ether groups represented by formula (I):

$$(R^2)(R^1)C=C(R^3)-O-\quad\quad\quad (I)$$

wherein $R^1$, $R^2$ and $R^3$, which may be the same or different, each represents hydrogen atom, an alkyl group or an aryl group and any two of $R^1$, $R^2$ and $R^3$ may be bonded together to form a saturated or an olefinically unsaturated ring, (b) a linear polymer having an acid group and/or hydroxy group, and (c) a compound which generates an acid by decomposition upon irradiation with the active light, and wherein the component (a) and the component (b) are thermally crosslinked during or after the formation of the photosensitive layer.

In contrast to the conventional method in which the positive working photosensitive layer using o-quinonediazide forms an image by the difference in the exposure solubility, the present invention has an advantage in that the image area is composed of a polymer having a crosslinked structure by heating and therefore is made insoluble in an aqueous alkali solution and a solvent whereby an eluting latitude during the elution can be enlarged. Also, the present invention has an advantage in that, the crosslinked moiety in the non-image area is effectively hydrolyzed with an acid generated upon irradiation with light thereby making it soluble in the eluting solution, and, thus, an exposure time at the time of the whole surface exposure can be shortened.

The compound containing enol ether groups as a component (a) of the present invention is described hereinafter.

In the enol ether group of formula (I), when $R^1$, $R^2$ and $R^3$ are aryl groups, the aryl group has generally from 6 to 20 carbon atoms and may be substituted with a $C_{1-18}$ alkyl group, an alkoxy group, an aryloxy group, an acyl group, an acyloxy group, an alkylmercapto group, an aminoacyl group, a carboalkoxy group, nitro group, sulfonyl group, cyano group or a halogen atom.

When $R^1$, $R^2$ and $R^3$ represent alkyl groups, the alkyl group is preferably a straight-chain, branched or alicyclic alkyl group having from 1 to 20 carbon atoms and may be substituted with a halogen atom, cyano group, an ester group, oxy group, a $C_{1-18}$ alkoxy group, a $C_{6-20}$ aryloxy group or an aryl group.

Also, when any two groups of $R^1$ $R^2$ and $R^3$ is bonded to form a cycloalkyl group or a cycloalkenyl group, it generally represents a 3- to 8-membered ring, preferably a 5- or 6-membered ring.

In the present invention, of the enol ether groups represented by formula (I), an enol ether group wherein one of $R^1$, $R^2$ and $R^3$ is a methyl group or an ethyl group and the other groups are hydrogen atoms is preferred, and the enol ether group wherein $R^1$, $R^2$ and $^3$ are all hydrogen atoms, i.e., vinyl ether group, is more preferred.

In the present invention, various compounds containing two or more enol ether groups can be used, but these compounds are preferably those having a boiling point of 60° C. or higher under atmospheric pressure.

Preferred compounds of the component (a) include the vinyl ether compound represented by the following formula (II) or (III):

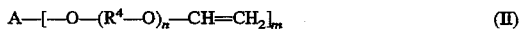

$$A\text{—}[\text{—}O\text{—}(R^4\text{—}O)_n\text{—}CH\text{=}CH_2]_m \quad (II)$$

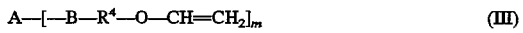

$$A\text{—}[\text{—}B\text{—}R^4\text{—}O\text{—}CH\text{=}CH_2]_m \quad (III)$$

wherein A represents an m-valent polyvalent chain-form hydrocarbon linking group, polyvalent aromatic hydrocarbon linking group, polyvalent heterocyclic linking group, or linking group which is a polyarylalkane represented by the following formula (IV) or (V) from which hydrogen atoms of m numbers have been removed; B represents —COO—, —NHCOO— or —NHCONH—; $R^4$ represents a straight chain or branched chain alkylene group having from 1 to 10 carbon atoms; n is 0 or an integer of from 1 to 10; and m represents an integer of from 2 to 6.

When A is an m-valent polyvalent chain-form hydrocarbon linking group, the m-valent polyvalent chain-form hydrocarbon linking group represents a residual atomic group of a chain-form hydrocarbon from which hydrogen atoms of m numbers have been removed. Preferably, it is a straight-chain, branched or alicyclic m-valent chain-form hydrocarbon linking group having from 2 to 20 carbon atoms (for example, an alkyl group), and specific examples thereof include ethylene, triethylene, tetramethylene and neopentylene groups.

When A is an m-valent polyvalent aromatic hydrocarbon linking group, the m-valent polyvalent aromatic hydrocarbon linking group represents a residual atomic group of an aromatic hydrocarbon from which hydrogen atoms of m numbers have been removed. Specific examples of the aromatic hydrocarbon include benzene, biphenyl, naphthalene, anthracene and phenanthracene.

When A is an m-valent polyvalent heterocyclic linking group, the m-valent polyvalent heterocyclic linking group represents a residual atomic group of an aromatic heterocyclic hydrocarbon from which hydrogen atoms of m numbers have been removed. Specific examples of the aromatic heterocyclic hydrocarbon include a 5-membered or 6-membered monocyclic or condensed heterocyclic ring such as imidazole, thiazole, oxazole, pyrrole, furan, thiophene, carbazole, phenothiazine and phenoxazine.

When A is an m-valent polyarylalkane linking group represented by formula (IV) or (V), the m-valent polyarylalkane linking group represents a residual atomic group of the polyarylalkane represented by formula (IV) or (V) from which hydrogen atoms of m numbers have been removed.

$$Ar^1\text{—}C(R^5)(R^6)\text{—}Ar^2 \quad (IV)$$

$$Ar^1\text{—}X\text{—}Ar^2 \quad (V)$$

In formulae (IV) and (V), $Ar^1$ and $Ar^2$ each represents an unsubstituted or substituted aryl group, and specific examples of the unsubstituted aryl group include phenyl, biphenylyl, naphthyl, anthryl and phenanthryl groups.

$R^5$ and $R^6$ each represents an alkyl group having from 1 to 18 carbon atoms, an aryl group having from 6 to 20 carbon atoms, or $R^5$ and $R^6$ are bonded together to represent a cycloalkyl group having from 3 to 10 carbon atoms. Each of $R^5$ and $R^6$ may have a substituent.

X represents oxygen atom, a sulfur atom, carbonyl group, thiocarbonyl group, sulfonyl group or a group represented by the following formula (VI):

$$\text{—}(CH(R^7))_a\text{—}(Ar^3)_b\text{—}(CH(R^8))_c\text{—} \quad (VI)$$

wherein a, b and c each represents an integer of from 0 to 6; $R^7$ and $R^8$ each represents an alkyl group having from 1 to 4 carbon atoms or phenyl group, and $Ar^3$ represents an unsubstituted or substituted aryl group as defined for $Ar^1$ and $Ar^2$ above.

Examples of substituents in the case of where $Ar^1$ and $Ar^2$ each is a substituted aryl group, and $R^5$ and $R^6$ each is a substituted alkyl, aryl and cycloalkyl groups include a $C_{1-18}$ alkyl group, an alkoxy group, an aryloxy group, a hydroxyl group, an acyl group, nitro group, cyano group and a halogen atom.

The compound represented by formula (II) can be synthesized by, for example, a method described in Stephen, C. Lapin, *Polymers Paint Colour Journal*, 179(4237), 321 (1988), that is, a reaction between a polyhydric alcohol or a polyvalent phenol with acetylene, or a reaction between a polyhydric alcohol or a polyvalent phenol with a halogenated alkyl vinyl ether.

Specific examples of the compounds of formula (II) include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,2-di(vinyl ether methoxy) benzene, 1,2-di(vinyl ether ethoxy)benzene, as well as the compounds represented by the following formulae (II-1) to (II-41), but the present invention is not limited to these compounds.

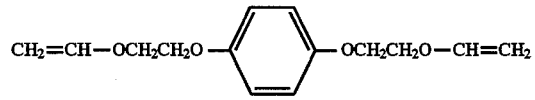

(II-1)

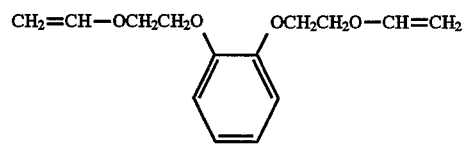

(II-2)

-continued
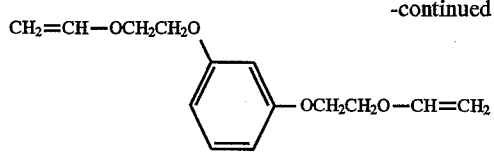 (II-3)
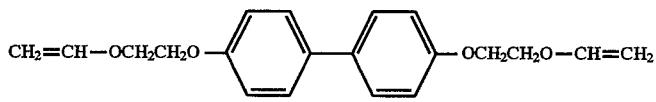 (II-4)
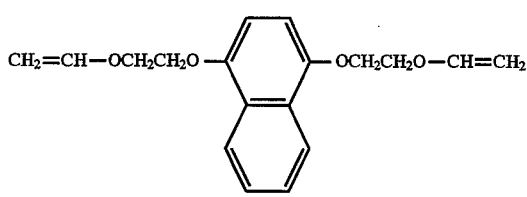 (II-5)
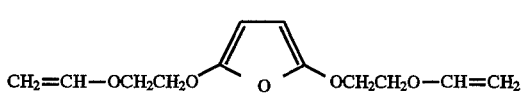 (II-6)
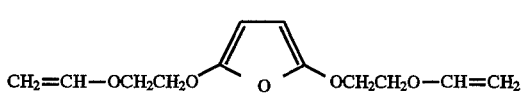 (II-7)
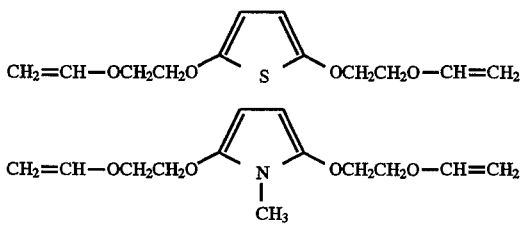 (II-8)
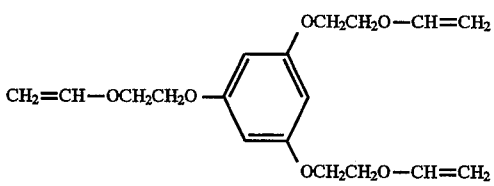 (II-9)
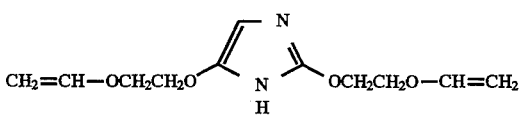 (II-10)
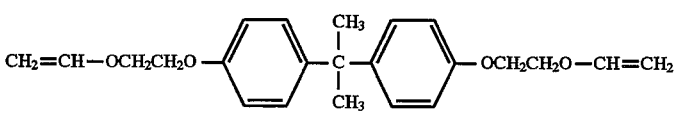 (II-11)
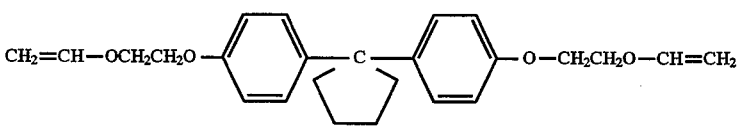 (II-12)
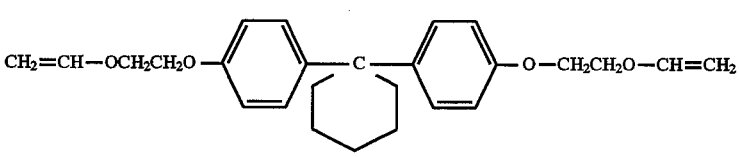 (II-13)
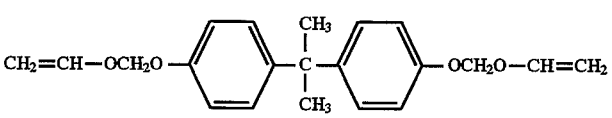 (II-14)
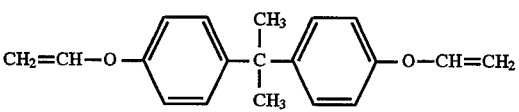 (II-15)

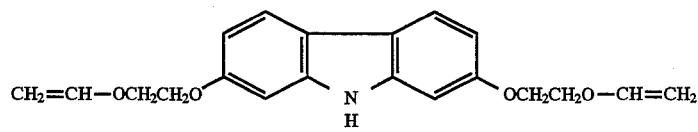
(II-16)
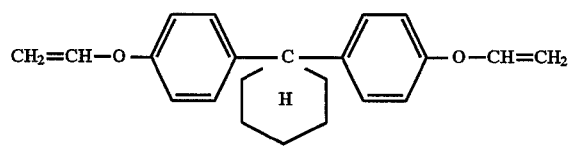
(II-17)
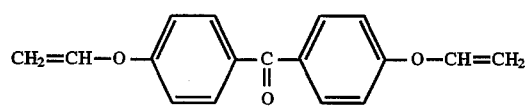
(II-18)
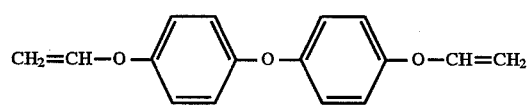
(II-19)
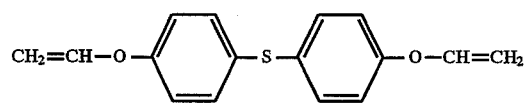
(II-20)
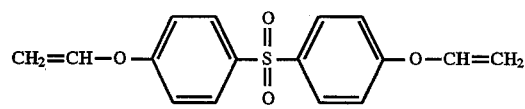
(II-21)
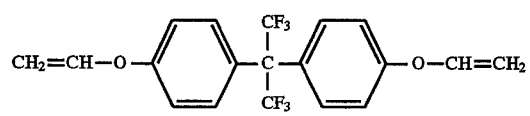
(II-22)
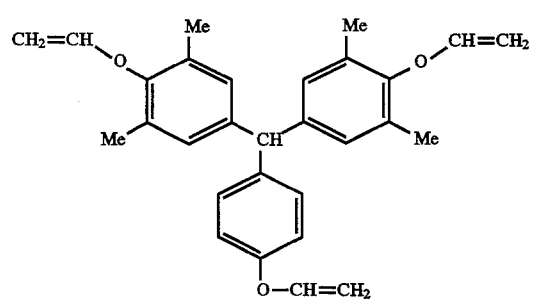
(II-23)
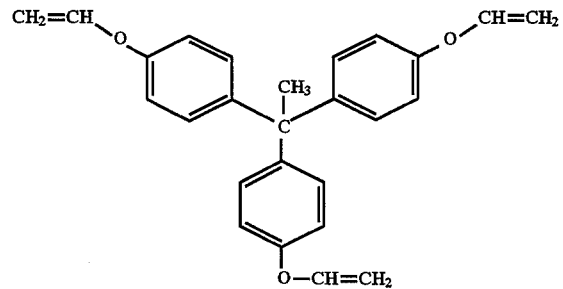
(II-24)

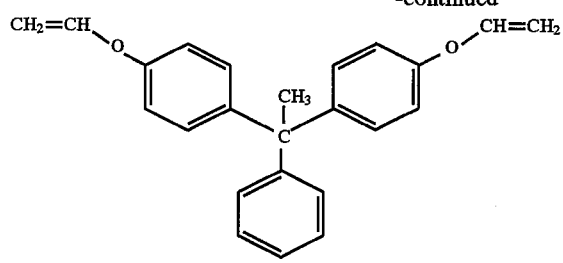
(II-25)
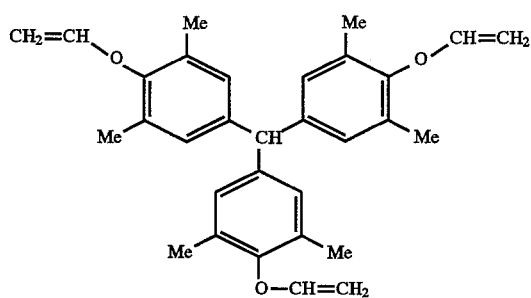
(II-26)
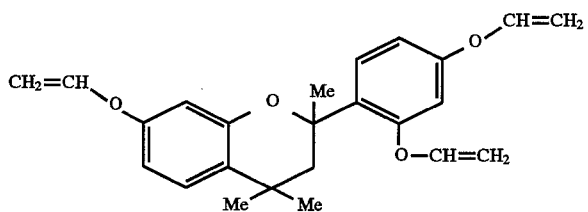
(II-27)
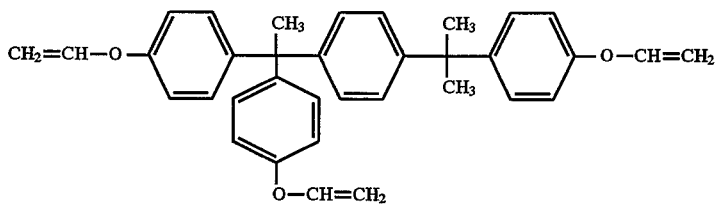
(II-28)
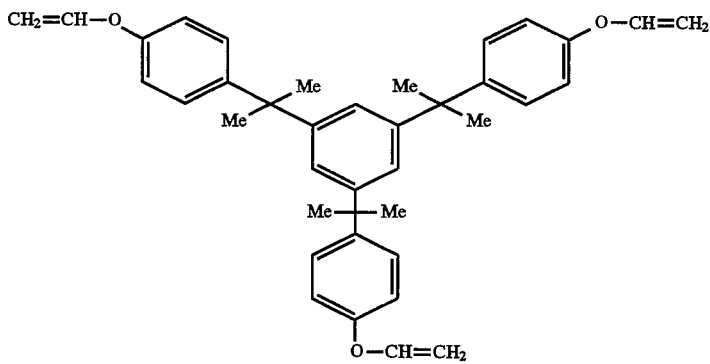
(II-29)
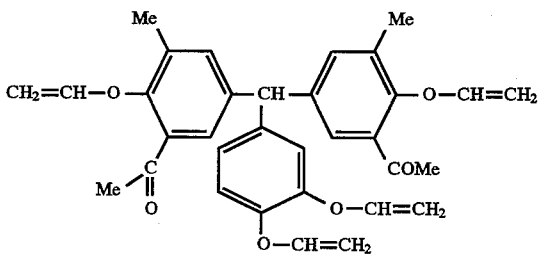
(II-30)

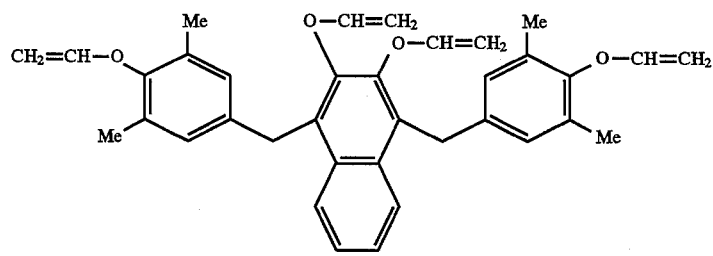
(II-31)
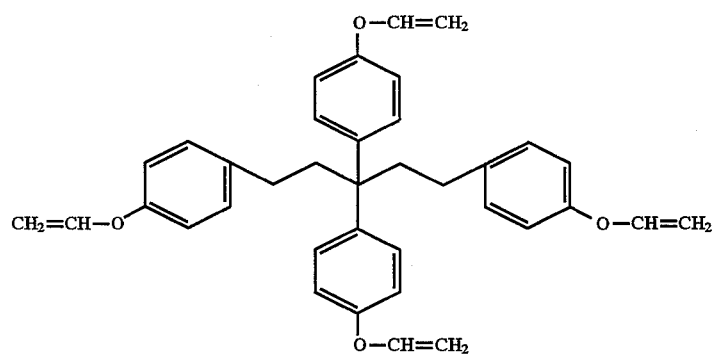
(II-32)
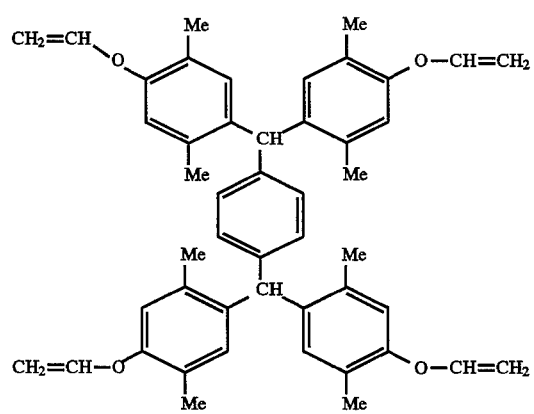
(II-33)
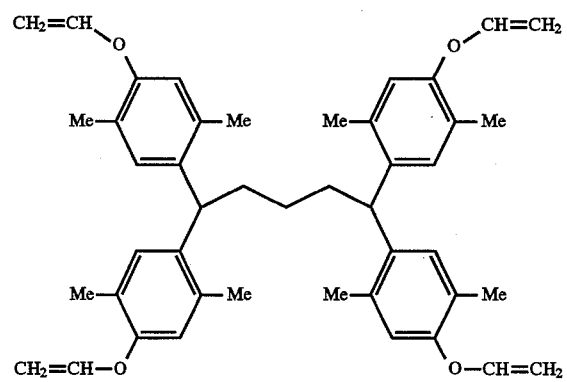
(II-34)
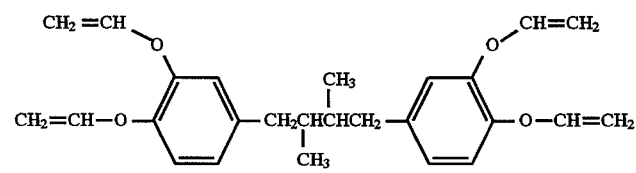
(II-35)

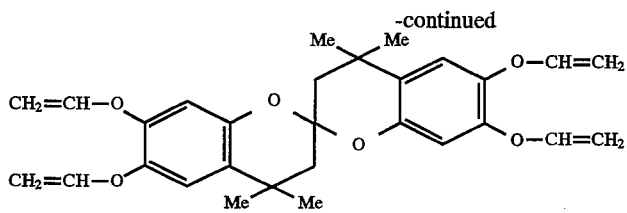 (II-36)

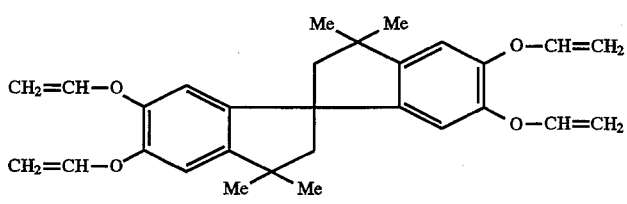 (II-37)

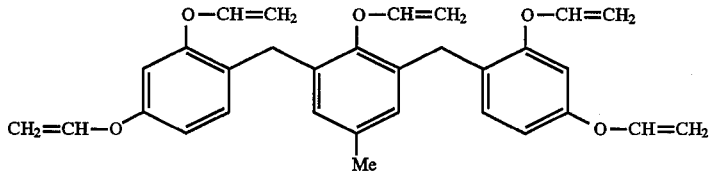 (II-38)

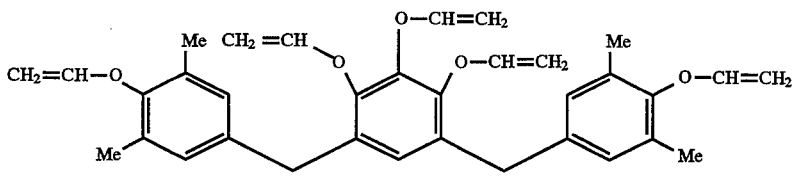 (II-39)

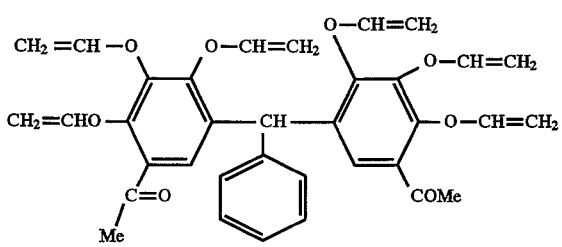 (II-40)

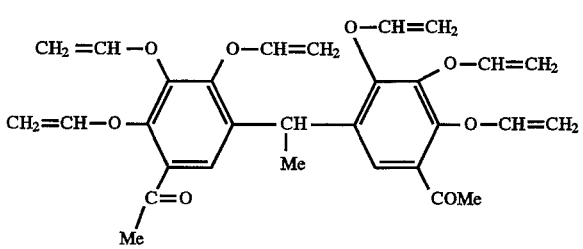 (II-41)

On the other hand, the compounds represented by formula (III) (in the case where B is —CO—O—) can be prepared by reacting a polyvalent carboxylic acid with a halogenated alkyl vinyl ether.

Specific examples of the compounds thereof include terephthalic acid diethylene vinyl ether, phthalic acid diethylene vinyl ether, isophthalic acid diethylene vinyl ether, phthalic acid dipropylene vinyl ether, terephthalic acid dipropylene vinyl ether, isophthalic acid dipropylene vinyl ether, maleic acid diethylene vinyl ether, fumaric acid diethylene vinyl ether, and itaconic acid diethylene vinyl ether, but the present invention is not limited to these compounds.

Further, the compounds containing a vinyl ether group which are suitably used in the present invention include the compounds containing a vinyl ether group synthesized by reacting a vinyl ether compound having an active hydrogen represented by the following formula (VII), (VIII) or (IX) with a compound having an isocyanate group.

 (VII)

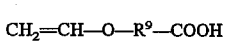 (VIII)

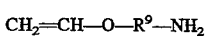 (IX)

wherein $R^9$ represents a straight-chain or branched alkylene group having from 1 to 10 carbon atoms.

The compounds containing an isocyanate group which can be used herein include the compounds described, for example, in Kakyouzai Handbook (Crosslinking Agents Handbook) (published by Taisei-sha (1981)).

Specific examples of the compound include polyisocyanates such as triphenylmethane triisocyanate, diphenylmethane diisocyanate, tolylene diisocyanate, a dimer of 2,4-tolylene diisocyanate, naphthalene-1,5-diisocyanate, o-tolylene diisocyanate, polymethylene polyphenyl isocyanate and hexamethylene diisocyanate, polyisocyanate adducts such as an adduct of tolylene diisocyanate and trimethylolpropane, an adduct of hexamethylene diisocyanate and water, and an adduct of xylylene diisocyanate and trimethylolpropane.

Various compounds having a vinyl ether group at the terminal can be produced by reacting the above-described compound containing an isocyanate group with the vinyl ether compound containing an active hydrogen. Examples of such compounds are illustrated hereinafter, but the scope of the present invention is not limited to these compounds.

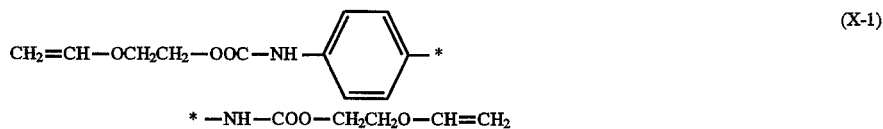
(X-1)

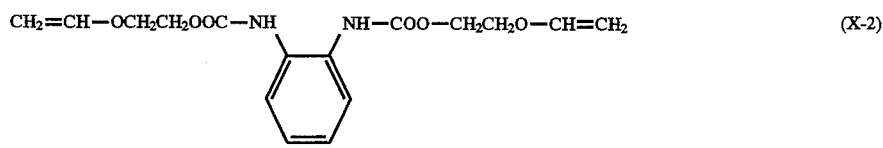
(X-2)

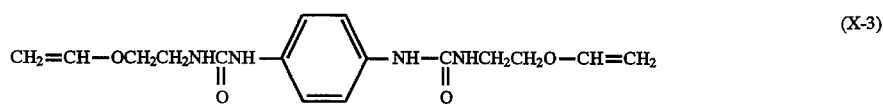
(X-3)

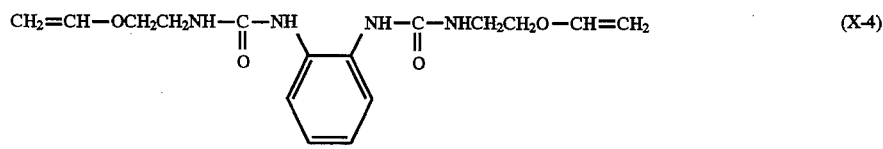
(X-4)

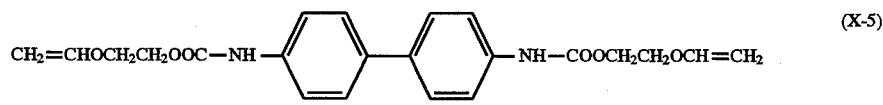
(X-5)

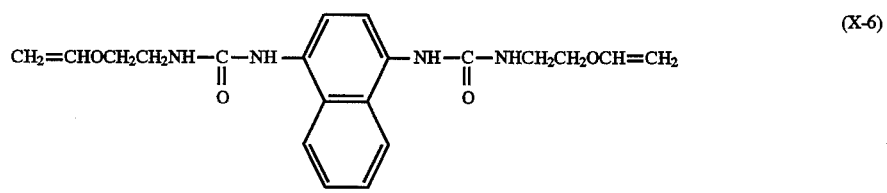
(X-6)

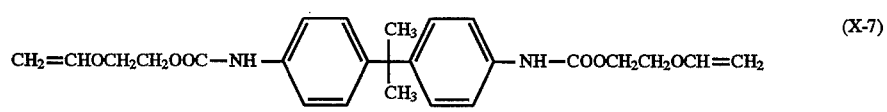
(X-7)

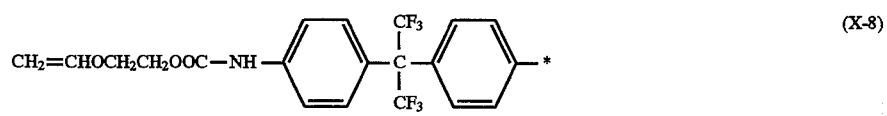
(X-8)

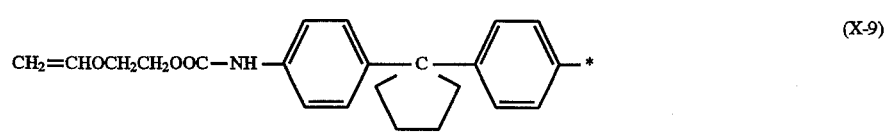
(X-9)

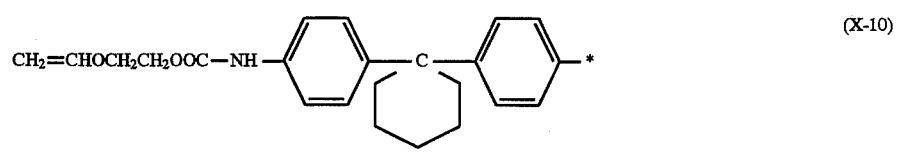
(X-10)

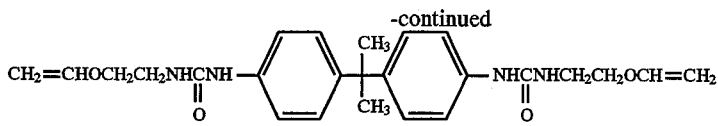
(X-11)

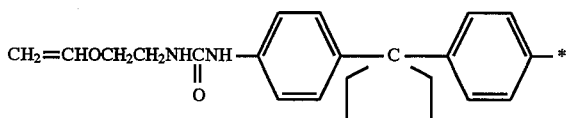
(X-12)

\* —NH—C—NHCH$_2$CH$_2$OCH=CH$_2$
         ‖
         O

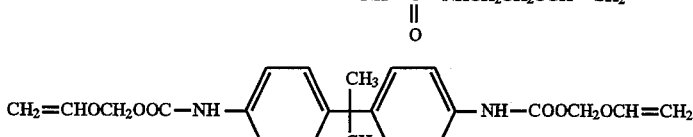
(X-13)

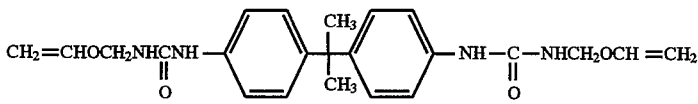
(X-14)

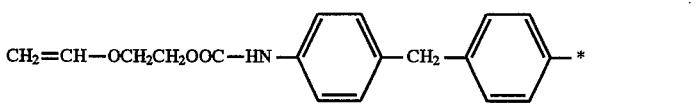
(X-15)

\* —NH—COOCH$_2$CH$_2$OCH=CH$_2$

The compounds containing at least two vinyl ether groups described above can be used alone, but may be used as a mixture of several types of these compounds.

The amount of the compound containing having at least two enol groups to be added in the positive working photosensitive composition is generally in the range of from 1 to 80% by weight, preferably from 5 to 50% by weight, relative to the total solid content of the positive working photosensitive composition.

The linear polymer having an acid group or hydroxy group (b) used in the present invention may be appropriately selected and used as long as it is able to be thermally crosslinked with a compound having at least two enol ether groups (a) and the crosslinked portion is effectively decomposed with an acid.

The above-described linear polymer can be generally synthesized by the known method for obtaining linear polymers. For example, the polymer can be obtained by copolymerizing a vinyl monomer having an acid group, preferably, carboxylic acid group, sulfonic acid group, a phosphoric acid group or sulfonamido group and/or a vinyl monomer having hydroxy group with other vinyl monomer copolymerizable therewith.

Examples of the vinyl monomer containing an acid group include acrylic acid, methacrylic acid, maleic acid, itaconic acid, crotonic acid, isocrotonic acid, p-vinylbenzoic acid, p-vinylbenzenesulfonic acid, p-vinylcinnamic acid, maleic acid monomethyl ether and maleic acid monoethyl ether, but the present invention is not limited to these compounds.

Examples of the vinyl monomer having hydroxy group include 2-hydroxyethylstyrene, 2-hydroxyethy acrylate, 2-hydroxyethyl methacrylate, 2,3-dihydroxypropyl methacrylate, p-2-hydroxyethylstyrene and p-hydroxystyrene, but are not limited to these compounds.

Examples of other vinyl monomers which are copolymerizable with the above-described monomers include acrylonitrile, acrylamide, methacrylamide, acrylic acid esters, methacrylic acid esters, vinylbenzoate, vinyl chloride, vinylidene chloride, styrene, vinyl acetate, N-(4-sulfamoylphenyl)methacrylamide, N-phenylphosphonyl methacrylamide, butadiene, chloroprene and isoprene, but the present invention is not limited to these compounds.

Of the other copolymerizable monomers, (meth)acrylic acid esters are preferred from the standpoint of electrophotographic properties, and the ester moiety thereof is preferably a straight-chain or branched alkyl group having from 1 to 18 carbon atoms or a group having an aromatic ring. Particularly preferred examples include (meth)acrylic acid esters having an aromatic ring.

Specific examples of the (meth)acrylic acid ester having an aromatic ring include those having an aromatic hydrocarbon group as an ester residual group of the (meth)acrylic acid esters, for example, phenyl group, o-tolyl group, m-tolyl group, p-tolyl group, p-t-butylphenyl group, chlorophenyl group, benzyl group, o-methylbenzyl group, m-methylbenzyl group, p-methylbenzyl group, p-ethylbenzyl group, p-propylbenzyl group, 2-phenylethyl group, 2-(p-methylphenyl)-ethyl group, 2-(o-methylphenyl)-ethyl group, 3-phenylpropyl group, α-naphthylmethyl group and β-naphthylmethyl group, and those having an aromatic heterocyclic group such as furan, thiophene, pyrrole, pyran, thiopyran, thiazole, imidazole, pyrimidine, triazine, indole, quinoline and purine, for example, 2-pyridinomethyl group, 4-pyridinomethyl group, imidazolylmethyl group, 4-indolylmethyl group, pyrimidinomethyl group and thiazolylmethyl group.

The alkyl group or the aromatic ring group of the ester moiety according to the present invention may have a substituent, and examples of the substituent include hydrogen atom, an alkyl group, an alkenyl group, an aryl group, an aralkyl group, an alkoxy group, an aryloxy group, an alkoxycarbonyl group, a halogen atom, nitro group, amido group, cyano group, carbonyl group, trifluoromethyl group, amino group and dialkylamino group. Preferred substituents include hydrogen atom, an alkyl group having from 1 to 5 carbon atom, an alkenyl group having from 2 to 5 carbon atoms (e.g., allyl group), an aryl group having from 6 to 10 carbon atoms, an aralkyl group having from 7 to 10 carbon atoms, an alkoxy group having from 1 to 5 carbon atom, an aryloxy group having from 6 to 10 carbon atoms, an alkoxycarbonyl group having from 2 to 5 carbon atoms, a halogen atom, amino group, nitro group, cyano group, trifluoromethyl group, carbonyl group, amido group, and an amino group substituted with an alkyl group having from 1 to 5 carbon atoms.

In the (meth)acrylic acid esters having an aromatic ring according to the present invention, the aromatic ring is preferably an aromatic hydrocarbon, and further preferred (meth)acrylic acid esters having an aromatic ring include substituted or unsubstituted benzyl acrylate, benzyl methacrylate, phenethyl acrylate, phenethyl methacrylate, phenyl acrylate and phenyl methacrylate.

The vinyl monomer having an acid group and/or hydroxy group and other copolymerizable monomer can be copolymerized in any combination and in any number of the monomers, but a ratio of the vinyl monomer containing an acid group and/or hydroxy group and the other copolymerizable monomer is suitably in the range of from 2 to 80:98 to 20%, preferably from 5 to 70:95 to 30%, by weight.

The linear polymer having an acid group (b) may also be obtained, for example, by reaction of a dihydroxy compound having an acid group with a diisocyanate compound or by co-condensation of a dihydroxy compound having an acid group with a dicarboxylic acid compound.

For example, a linear polyurethane resin containing a carboxyl group may be obtained by reacting in an equimolar amount a dihydroxy compound having an acid group such as 3,5-dihydroxybenzoic acid, 2,2-bis(hydroxymethyl) propionic acid, 2,2-bis(2-hydroxyethyl)propionic acid, 2,2-bis(3-hydroxypropyl)propionic acid, bis(hydroxymethyl) acetic acid, bis(4-hydroxyphenyl)acetic acid, 4,4-bis(4-hydroxyphenyl)pentanoic acid and tartaric acid with a diisocyanate compound such as 2,4-tolylene diisocyanate, a dimer of 2,4-tolylene diisocyanate, 4,4'-diphenylmethane diisocyanate, 1,5-naphthylene diisocyanate, hexamethylene diisocyanate, trimethylhexamethylene diisocyanate and 4,4'-methylenebis(cyclohexyl isocyanate).

Further, a diol compound which has no carboxyl group and which may have other substituents which do not react with isocyanate may also be used together. Examples of such diol compounds include ethylene glycol, diethylene glycol, triethylene glycol, neopentyl glycol, 1,3-butylene glycol, bisphenol A, hydrogenated bisphenol A, hydrogenated bisphenol F, and an ethylene oxide adduct of bisphenol A, but the present invention is not limited to these compounds.

Also, the linear polymer (b) can be obtained by co-condensation of the above-described dihydroxy compound having an acid group and, if necessary, the above-described other diol with a bifunctional carboxylic acid, for example, phthalic acid, isophthalic acid, terephthalic acid, fumaric acid, itaconic acid and adipic acid.

A ratio of the dihydroxy compound containing an acid group and other monomer unit is suitably in the range of from 2 to 80:98 to 20%, preferably in the range of from 5 to 70:95 to 30%, by weight.

Further, the linear polymer having a hydroxy group (b) used in the present invention include a resin containing a phenolic hydroxy group and a resin having an alcoholic hydroxy group. More specifically, the resin containing a phenolic hydroxy group include novolak resins such as a phenol-formaldehyde resin, an m-cresol-formaldehyde resin, a p-cresol-formaldehyde resin, an o-cresol-formaldehyde resin, m-/p-mixed cresol-formaldehyde resin, and phenol/cresol-formaldehyde resin, a resol-type phenol resins, phenol-modified xylene resins, polyhydroxystyrene, polyhalogenated hydroxystyrene, and an acrylic resin having a phenolic hydroxy group, and the resin having an alcoholic hydroxy group includes polyvinyl alcohol resins, and polyvinylacetal resins such as polyvinylformal and polyvinylbutyral, but the present invention is not limited to these compounds.

The molecular weight of these linear polymers is generally from about 1,000 to about 1,000,000, preferably from 1,500 to 200,000.

These linear polymers can be used singly, but a mixture of several kinds may also be used. The amount of the linear polymer to be added to the photosensitive composition is generally in the range of from about 1 to about 95% by weight, preferably from 20 to 90%, relative to the total solid content of the photosensitive composition.

The compound (c) which generates an acid by decomposition upon irradiation with an active light used in the present invention can be appropriately selected from a photoinitiator for the photocationic polymerization, a photoinitiator for the photoradical polymerization, a photodecoloring agent for coloring materials, a photodiscoloring agent, or known compounds which generate an acid by light used for microresists, and a mixture thereof.

Examples of such compounds include the following compounds:

diazonium salts described in S. I. Schlesinger, *Photogra. Sci. Eng.*, 18, 387 (1974) and T. S. Bal et al, *Polymer*, 21, 423 (1980);

ammonium salts described in U.S. Pat. Nos. 4,069,055, 4,069,056 and Re 27,992, and JP-A-4-365049;

phosphonium salts described in D. C. Necker et al, *Macromolecules*, 17, 2468 (1984), C. S. Wen et al, *Teh, Proc. Conf. Rad. Curing ASIA*, p478 Tokyo, Oct (1988), and U.S. Pat. Nos. 4,069,055 and 4,069,056;

iodonium compounds described in J. V. Crivello et al, *Mcromolecules*, 10(6), 1307 (1977), *Chem. & Eng. News*, Nov. 28, p31 (1988), European Patent No. 104,143, U.S. Pat. Nos. 339,049 and 410,201, and JP-A-2-150848 and JP-A-2-296514;

sulfonium salts described in J. V. Crivello et al, *Polymer J.* 17, 73 (1985), J. V. Crivello et al, *J. Org. Chem.*, 43, 3055 (1978), W. R. Watt et al, *J. Polymer Sci.*, Polymer Chem. Ed., 22, 1789 (1984), J. V. Crivello et al, *Polymer Bull.*, 14, 279 (1985), J. V. Crivello et al, *Macromolecules*, 14(5), 1141(1981), J. V. Crivello et al, *J. Polymer Sci.*, Polymer Chem. Ed., 17, 2877 (1979), European Patent Nos. 370,693, 233,567, 297,443, 297,442, 161,811, 410,201 and 339,049, U.S. Pat. Nos. 4,933,377, 4,760,013, 4,734,444, 2,833,827 and 3,902,114, and German Patent Nos. 2,904,626, 3,604, 580 and 3,604,581;

selenonium salts described in J. V. Crivello et al, *Macromolecules*, 10(6), 1307 (1977), J. V. Crivello et al, *J. Polymer Sci.*, Polymer Chem. Ed., 17, 1047 (1979);

osmium salts such as arsonium salts described in C. S. Wen et al, *Teh, Proc. Conf. Rad. Curing ASIA*, p478, Tokyo, Oct (1988);

organic halogen compounds described in U.S. Pat. No. 3,905,815, JP-B-46-4605, JP-A-48-36281, JP-A-55-32070, JP-A-60-2399736, JP-A-61-169835, JP-A-61-169837, JP-A-62-58241, JP-A-62-212401, JP-A-63-70243 and JP-A-63-298339;

organometals/organohalides described in K. Meier et al, *J. Rad. Curing*, 13(4), 26 (1986), T. P. Gill et al, *Inorg. Chem.*, 19, 3007 (1980), D. Astruc, *Acc. Chem. Res.*, 19(12), 377 (1996), and JP-A-2-161445;

photo-acid generators having an o-nitrobenzyl-type protective group described in S. Hayase et al, *J. Polymer Sci.*, 25, 753 (1987), E. Reichmanis et al, *J. Polymer Sci.*, Polymer Chem. Ed., 23, 1 (1985), Q. Q. Zhu et al, *J. Photochem.*, 36, 85, 39, 317 (1987), B. Amit et al, *Tetrahedron Lett.*, (24) 2205 (1973), D. H. R. Barton et al, *J. Chem Soc.*, 3571 (1965), P. M. Collins et al, *J. Chem. Soc.*, Parkin I, 1695 (1975), M. Rudinstein et al, *Tetrahedron Lett.*, (17), 1445 (1975), J. W. Walker et al, *J. Am. Chem. Soc.*, 110, 7170 (1988), S. C. Busman et al, *J. Imaging Techno.*, 11(4), 191 (1985), H. M. Houlihan et al, *Mcromolecules*, 21, 2001 (1988), P. M. Collins et al, *J. Chem. Soc., Chem. Commun.*, 532 (1972), S. Hayase et al, *Macromolecules*, 18, 1977 (1985), E. Reichmanis et al, *J. Electrochem. Soc., Solid State Sci. Technol.*, 130(6), F. M. Houlihan et al, *Mcromolecules*, 21, 2001 (1988), European Patent Nos. 0,290,750, 046,083, 156,535, 271,851 and 0,388,343, U.S. Pat. Nos. 3,901,710, 4,181,531 and JP-A-60-198538, and JP-A-53-133022;

compounds which generate a sulfonic acid through photodecomposition represented by iminosulfonates described in M. TUNOOKA et al, *Polymer Preprints Japan*, 38(8), G. Berner et al, *J. Rad. Curing*, 13(4), W. J. Mijs et al, *Coating Technol.*, 55(697), 45 (1983), Akzo, J. Adachi et al, *Polymer Preprints, Japan*, 37(3), European Patent Nos. 0,199,672, 84,515, 199,672, 044,115 and 0,101,122, U.S. Pat. Nos. 4,618,564, 4,371,605 and 4,431,774, JP-A-64-18143, JP-A-2-245756, and JP-A-4-365048; and disulfone compounds described in JP-A-61-166544.

Also, compounds into which the above-described group generating an acid by light or a compound thereof has been introduced into the main chain or side chains of polymers, for example, the compounds described in M. E. Woodhouse et al, *J. Am. Chem. Soc.*, 104, 5586 (1982), S. P. Pappas et al, *J. Imaging Sci.*, 30(5), 218 (1986), S. Kondo et al, *Makromol. Chem.*, Rapid Commun., 9, 625 (1988), Y. Yamada et al, *Mckromol. Chem.*, 152, 153, 164 (1972), J. V. Crivello et al, *J. Polymer Sci.*, Polymer Chem. Ed., 17, 3845 (1979), U.S. Pat. No. 3,849,137, German Patent No. 3,914, 407, JP-A-63-26653, JP-A-55-164824, JP-A-62-69263, JP-A-63-1460387, JP-A-63-163452, JP-A-62-153853, and JP-A-63-146029 may be used.

Further, compounds which generate an acid by light described in V. N. R. Pillai, *Synthesis*, (1), 1(1980), A. Abad et al, *Tetrahedron Lett.*, (47)4555 (1971), D. H. R. Barton et al, *J. Chem. Soc.*, (D), 329 (1970), U.S. Pat. No. 3,779,778, and European Patent No. 126,712 may be used.

Of the compounds (c) which generate an acid by decomposition upon irradiation with the above-described active light, the compounds which may be used particularly effectively are described hereinafter.

(1) Oxazole derivatives represented by the following formula (XI) substituted with a trihalomethyl group or s-triazine derivatives represented by the following formula (XII).

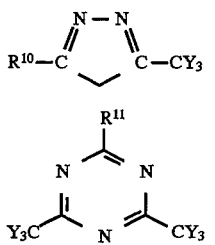

wherein $R^{10}$ represents a substituted or unsubstituted aryl group or an alkenyl group, $R^{11}$ represents a substituted or unsubstituted aryl group, an alkenyl group, an alkyl group or $-CY_3$ in which Y represents a chlorine atom or a bromine atom.

Specific examples of the above-described oxazole derivatives (XI) and s-triazine derivatives (XII) include the following compounds XI-1 to XI-8 and XII-1 to XII-10, but the present invention is not limited thereto.

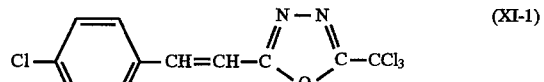

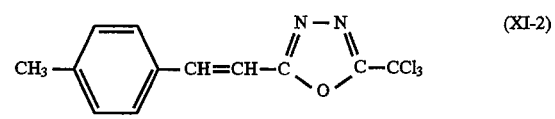

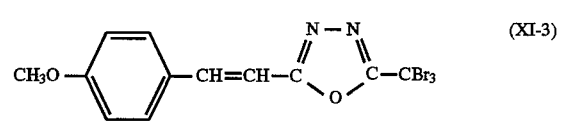

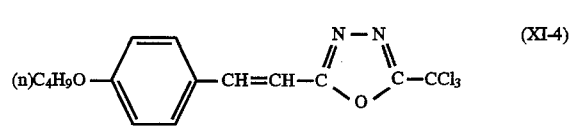

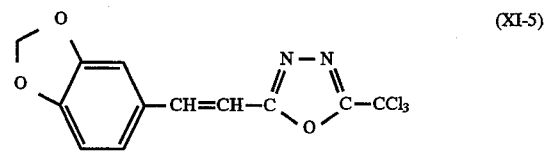

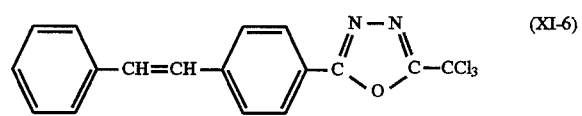

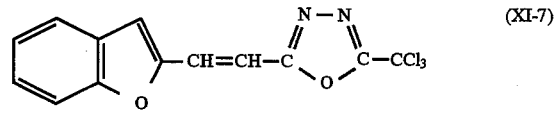

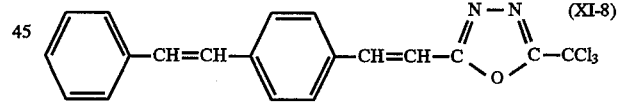

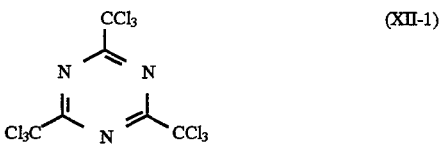

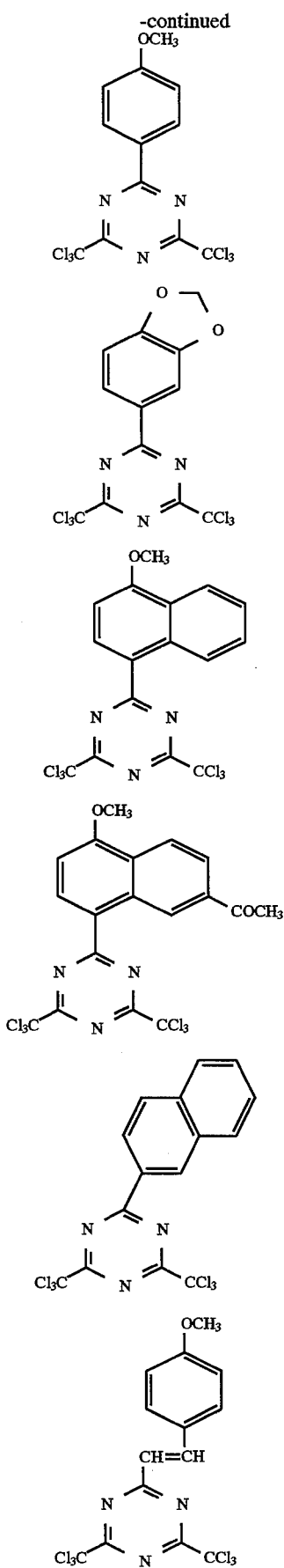
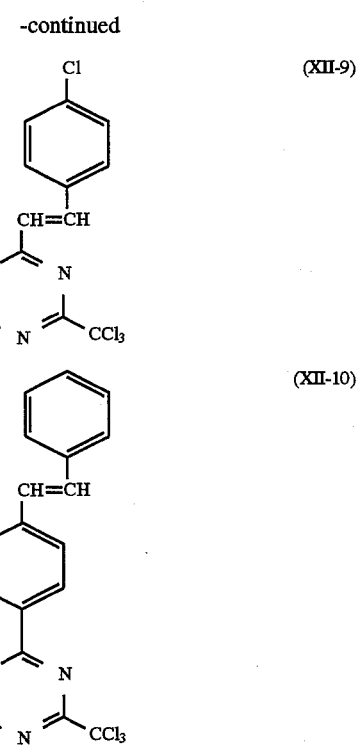

(2) Iodonium salts represented by the following formula (XIII) or sulfonium salts represented by the following formula (XIV):

In the above formulae, $Ar^4$ and $Ar^5$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, hydroxy group, mercapto group and a halogen atom.

$R^{12}$, $R^{13}$ and $R^{14}$ each independently represents a substituted or unsubstituted alkyl group or an aryl group, and preferably an aryl group having from 6 to 14 carbon atoms, an alkyl group having from 1 to 8 carbon atoms or a substituted derivative thereof. Preferred substituents for the aryl group include an alkoxy group having from 1 to 8 carbon atoms, an alkyl group having from 1 to 8 carbon atoms, nitro group, carboxyl group, hydroxy group and a halogen atom, and preferred substituents for the alkyl group include an alkoxy group having from 1 to 8 carbon atoms, carboxyl group and an alkoxycarbonyl group.

$Z^-$ represents a pair anion, for example, $BF_4^-$, $AsF_6^-$, $PF_6^-$, $SbF_6^-$, $SiF_6^-$, $ClO_4^-$, $CF_3SO^-$, $BPh_4^-$ (wherein Ph=phenyl), a condensed polynucleric aromatic sulfonic acid anion such as naphthalene-1-sulfonic acid anion and anthraquinonesulfonic acid anion, and a dye containing a sulfonic acid group, but the present invention is not limited to thereto.

Further, two of $R^{12}$, $R^{13}$ and $R^{14}$, as well as $Ar^4$ and $Ar^5$ each may be bonded therewith via a single bond or a substituent.

The above-described onium salts are known and may be synthesized by the method as described in, for example, J. W. Knapczyk et al, *J. Am. Chem. Soc.*, 91, 145 (1969), A. L. Maycok et al, *J. Org. Chem.*, 35, 2532 (1970), E. Goethas et al, *Bull. Soc. Chem. Belg.*, 73, 546 (1964), H. M. Leicester, *J. Am. Chem. Soc.*, 51, 3587 (1929), J. B. Crivello et al, *J. Polym. Chem. Ed.*, 18, 2677 (1980), U.S. Pat. Nos. 2,807,648 and 4,247,473 and JP-A-53-101331.

Specific examples of the onium compounds of formulae (XIII) and (XIV) include the following compounds XIII-1 to XIII-8 and XIV-1 to XIV-6, but the present invention is not limited to these compounds.

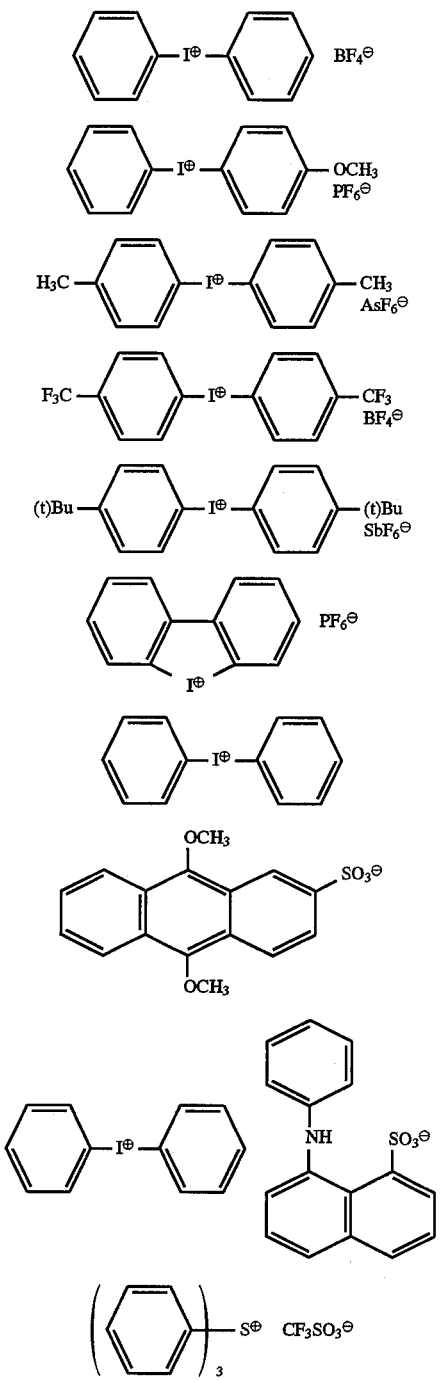

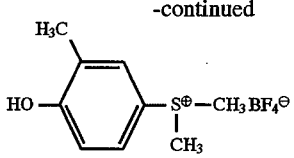

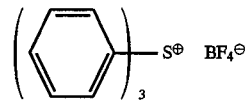

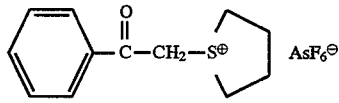

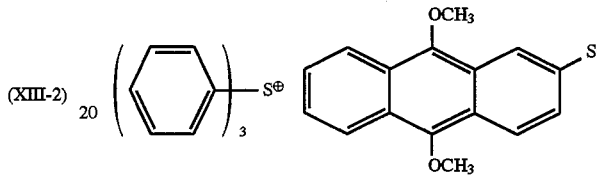

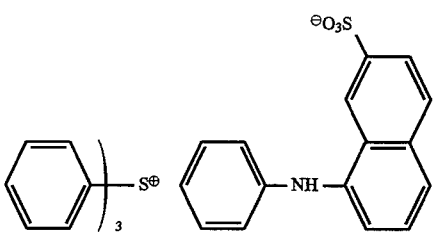

(3) Disulfonic acid derivatives represented by the following formula (XV) or iminosulfonate derivatives represented by the following general formula (XVI):

$$Ar^6-SO_2-SO_2-Ar^7 \quad (XV)$$

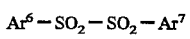

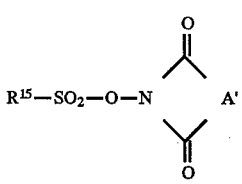

wherein $Ar^6$ and $Ar^7$ each independently represents a substituted or unsubstituted aryl group, $R^{15}$ represents a substituted or unsubstituted alkyl or aryl group, and A' represents a substituted or unsubstituted alkylene, alkenylene or arylene group. Specific examples of the compound represented by formulae (XV) and (XVI) include the following compounds XV-1 to XV-12 and XVI-1 to XVI-12, but the present invention is not limited to these compounds.

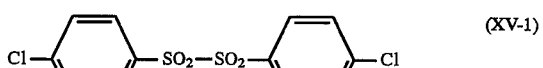

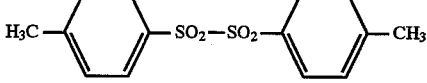

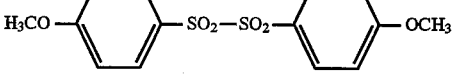

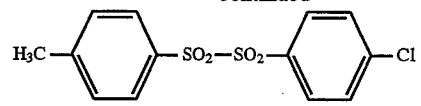 (XV-4)
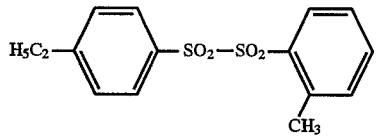 (XV-5)
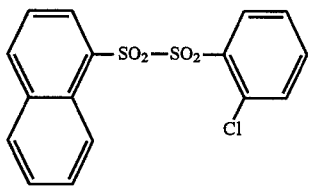 (XV-6)
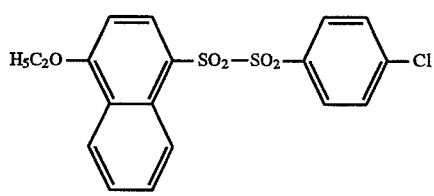 (XV-7)
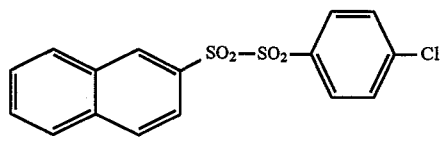 (XV-8)
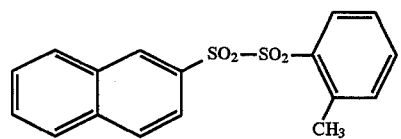 (XV-9)
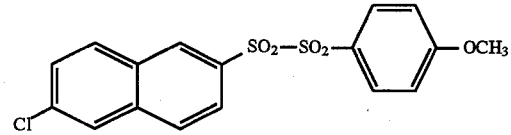 (XV-10)
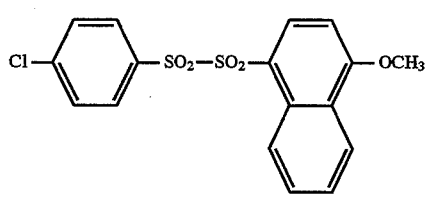 (XV-11)
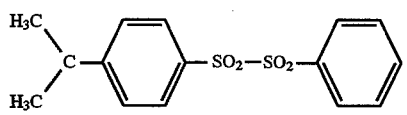 (XV-12)
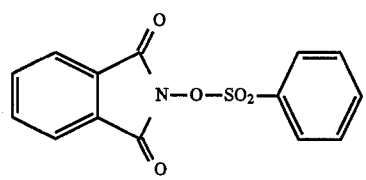 (XVI-1)
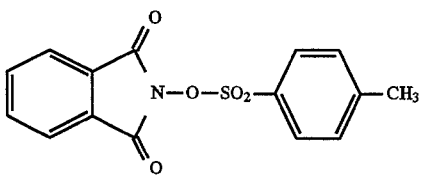 (XVI-2)
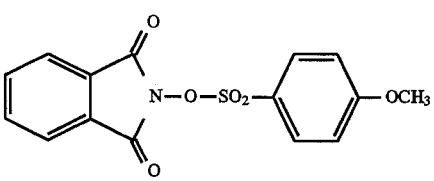 (XVI-3)
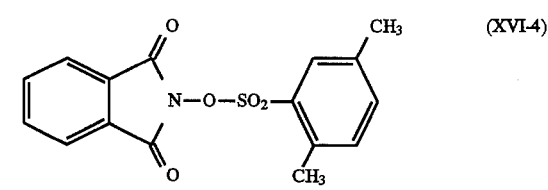 (XVI-4)
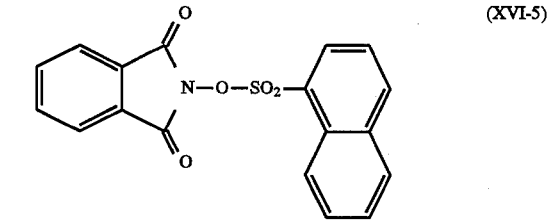 (XVI-5)
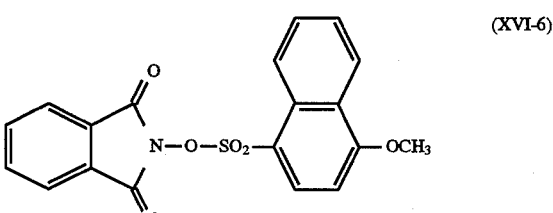 (XVI-6)
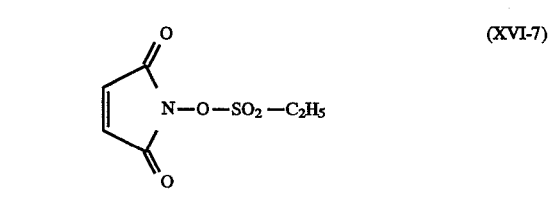 (XVI-7)
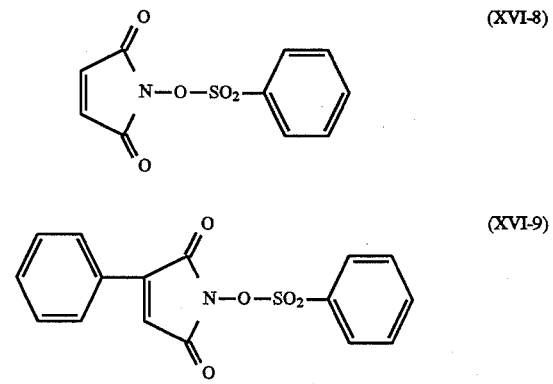 (XVI-8)
(XVI-9)

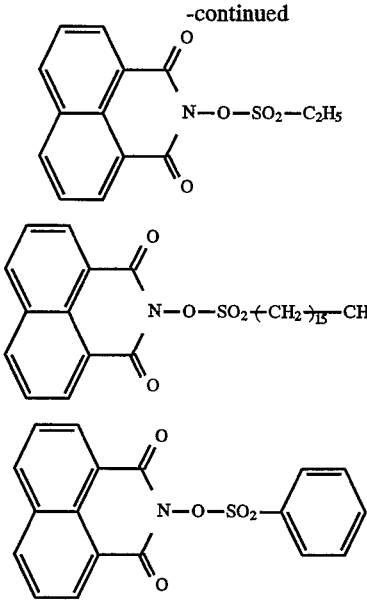

(XVI-10)

(XVI-11)

(XVI-12)

The amount of the compound (c) which generates an acid by decomposition upon irradiation with an active light to be added is generally in the range of from 0.001 to 40% by weight, preferably in the range of from 0.1 to 20% by weight, based on the total solid content of the photosensitive composition.

If desired, to the positive working photosensitive composition of the present invention may be added a compound for increasing a photo-acid generating effect of the compound which generates the acid (a sensitizing agent), a dye, a plasticizer as well as various known compounds for the purpose of adjusting the solubility of the positive working photosensitive composition in an aqueous alkali solution.

Examples of the sensitizing agent which can be used include an electron-donating compound such as pyrene and perylene, or merocyanine dyes and cyanine dyes, but are not restricted to these compounds.

The proportion of these sensitizing agents and the above component (c) is preferably in the range of from about 0.01/1 to about 20/1 at a molar ratio and from about 0.1/1 to about 5/1 at a weight ratio.

Further, in the positive working photosensitive composition according to the present invention, dyes may be used as a coloring agent, and preferred dyes are oil-soluble dyes or basic dyes. More specifically, examples of the dyes include Oil Yellow #101, Oil Yellow #130, Oil Pink #312, Oil Green BG, Oil Blue BOS, Oil Black BY, Oil Black BS, Oil Black T-505 (all of them are products of Oriental Chemical Industry Co., Ltd.), Crystal Violet (C142555), Methyl Violet (C142535), Rhodamine B (C145170B), Malachite Green (C142000) and Methylene Blue (C152015).

These dyes may be added to the photosensitive composition at a proportion of from about 0.01 to about 10% by weight, preferably from 0.1 to 3% by weight, based on the total solid content of the photosensitive composition.

Also, as a compound for adjusting the solubility of the positive working photosensitive composition of the present invention in an aqueous alkali solution, a cyclic acid anhydride and other fillers may be added to the photosensitive composition.

Examples of the cyclic acid anhydride include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride and pyromellitic acid as described in U.S. Pat. No. 4,115,128. By incorporating these cyclic acid anhydrides preferably in an amount of from 1 to 15% by weight based on the total solid content of the photosensitive composition, the sensitivity may be increased up to about 3 times at maximum.

Further, for the purpose of increasing the difference in the solubility between the exposed area and the unexposed area, a compound which is made alkali-soluble by hydrolysis with an acid as described, for example, in JP-A-62-27829, JP-A-63-250642, JP-A-63-139343, JP-A-4-63846, JP-A-4-70021, JP-A-4-67677, JP-A-60-191372, JP-A-63-139343, JP-A-48-39003, JP-A-51-120714, JP-A-53-133429, JP-A-55-126236, JP-A-1-106038 and JP-A-64-57258 can be used.

The photoconductive compounds used in the present invention are described hereinafter.

Various conventional compounds known as organic photoconductive compounds may be used in the present invention. Examples of such compounds include triazole derivatives, oxadiazole derivatives, imidazole derivatives, polyarylalkane derivatives, pyrazoline derivatives, pyrazolone derivatives, phenyldiamine derivatives, arylamine derivatives, amino-substituted chalcone derivatives, N,N-bicarbazyl derivatives, oxazole derivatives, styrylanthracene derivatives, fluorenone derivatives, hydrazone derivatives, benzidine derivatives, and stilbene derivatives.

In addition to the above low molecular weight photoconductive compounds, the following polymer compounds may also be used. Examples of such polymer compounds include vinyl polymers such as polyvinylcarbazole and derivatives thereof, polyvinyl pyrene, polyvinyl anthracene, poly-2-vinyl-4-(4'-dimethylaminophenyl)-5-phenyloxazole, poly-3-vinyl-N-ethylcarbazole, polymers such as polyacenaphthylene, polyindene, and a copolymer of acenaphthylene and styrene, and condensed resins such as a pyrene-formaldehyde resin, a bromopyrene-formaldehyde resin and an ethylcarbazole-formaldehyde resin.

Further, various pigments may be used as organic photoconductive compounds. Examples of the pigments include monoazo, bisazo and trisazo pigments, phthalocyanine dyes such as a metal phthalocyanine or a non-metal phthalocyanine, perylene dyes, indigo and thioindigo derivatives, quinacridone dyes, polycyclic quinone dyes, bisbenzimidazole pigments, squarium dyes, and azulenium dyes.

These organic photoconductive compounds may be used singly or in a combination of two or more pigments.

The organic photoconductive compound is preferably a phthalocyanine dye, and phthalocyanine compounds are described hereinafter.

In the present invention, various phthalocyanine compounds having different center metals and those having a substituent on the benzene ring thereof may be used. Examples of the phthalocyanine compound include non-metal phthalocyanines described in JP-B-44-14106, JP-B-45-8102, JP-A-58-182639 and JP-A-62-47054, copper phthalocyanines described in JP-A-50-38543, JP-A-50-95852, JP-A-51-108847, JP-A-51-109841, titanyl phthalocyanines described in JP-A-59-49544, JP-A-59-166959, JP-A-62-275272, JP-A-62-67094, JP-A-63-37163 and JP-A-63-116158, but the present invention is not limited to these compounds and conventional various phthalocyanine compounds may be used. Of these compounds, of γ-type, δ type ε-type and η-type copper phthalocyanines having a high sensitivity to a semiconductor laser, τ-type and χ-type non-metal phthalocyanines, and α-type, β-type, m-type and Y-type titanyl phthalocyanine are particularly preferred.

A chemical sensitizer may be added to the photoconductive compound of the present invention for the purpose of improving the sensitivity. Examples of the sensitizer include an electron attractive compound such as trinitrofluorenone, chloranil and tetracyanoethylene, and the compounds described in JP-A-58-65439, JP-A-58-102239, JP-A-58-129439 and JP-A-62-71965. These sensitizers may be used singly or in a combination of two or more sensitizers.

Further, a charge transport material which is known in the electrophotographic photosensitive material may be added to the photosensitive composition of the present invention.

The charge transport material is not restricted to the compounds specifically described above for the organic photoconductive compounds and all of the conventional charge transport materials may be used. These charge transport materials may be used, if desired, as a combination of two or more kinds.

From the standpoint of compatibility with binder resins and electrophotographic properties, the charge transport materials used in the present invention are preferably hydrazone derivatives as described, for example, in U.S. Pat. No. 3,717,462, JP-A-54-59143 (corresponding to U.S. Pat. No. 4,150,987), JP-A-55-52063, JP-A-55-52064, JP-A-55-46760, JP-A-55-85495, JP-A-57-11350, JP-A-57-148749 and JP-A-57-104144.

These chemical sensitizers and charge transport materials are used in the range of from about 0.01 to about 200% by weight relative to the photoconductive compound.

The photosensitive material used in the present invention for forming a lithographic printing plate comprises at least one photosensitive layer on an electroconductive support having a hydrophilic surface.

Further, at least one of the photosensitive layers contains a photoconductive compound, and at least one of the photosensitive layer containing the photoconductive compound and/or other photosensitive layers contains a positive working photosensitive composition. More specifically, when the photosensitive layer comprises two or more layers, the photoconductive layer having a photoconductive compound and the positive working photosensitive layer containing the positive working photosensitive composition may be separate layers or the same layer, and the both may be independently contained in at least any of the photosensitive layers. When the above-described photoconductive layer and the positive working photosensitive layer are separate layers, they are preferably photosensitive layers provided on the electroconductive support in the order of the positive working photosensitive layer and the photoconductive layer.

In the case where the photosensitive layer is only one layer, the photoconductive compound and the positive working photosensitive composition are contained in the same layer. The amounts of the photoconductive compound and the positive working photosensitive composition contained in the above-described single layer-type photosensitive layer can be in the range of from about 0.05 to about 50% by weight of the photoconductive compound and in the range of from about 50 to about 95% by weight of the positive working photosensitive composition. The coating amount of such a single layer-type photosensitive layer can be in the range of from 0.1 to 30 g/m², preferably from 0.5 to 10 g/m².

The amount of each of the composition contained in the case of where the photosensitive layer comprises two or more layers and the photoconductive layer and the positive working photosensitive layer are separate layers is described hereinafter. The amount of the compound containing enol ether groups in the positive working photosensitive layer comprising the positive working photosensitive composition is from 1 to 80% by weight based on the total solid content of the positive working photosensitive composition. Also, the amount of the linear polymer having an acid group and/or hydroxy group is from 1 to 95% by weight based on the total solid content of the positive working photosensitive composition, and the amount of the compound which generates an acid by light is from 0.001 to 40% by weight based on the total solid content of the positive working photosensitive composition. The coating amount of the above-described positive working photosensitive layer is from about 0.2 to about 10 g/m².

The photoconductive layer comprises mainly a photoconductive compound and a binder resin, and the amount of the photoconductive compound contained in the photoconductive layer is from 0.05 to 80% by weight, and the amount of the binder resin contained in the photoconductive layer is from 10 to 90% by weight, both based on the total solid content of the photoconductive layer. The binder resin in the photoconductive layer preferably contains an alkali-soluble resin as described in JP-B-2-46944 and Japanese Patent Application No. Hei-6-72142. Also, the composition which is the same as or different from the positive working photosensitive composition used in the positive working photosensitive layer can be used as a binder resin for the photoconductive layer. In addition, a chemical sensitizer and a charge transport material may be added to the photoconductive layer, and the amount thereof is in the range of from 0.01 to 200% by weight relative to the photoconductive compound. Further, if desired, in order to improve softness and coated surface condition of the photoconductive layer, a plasticizer, a surfactant, a matting agent and other various additives can be added to the photoconductive layer, in addition to the photoconductive compound and the binder resin. These additives can be incorporated in amounts which do not adversely affect electrostatic characteristics and eluting property of the photoconductive layer. In the case where the above-described positive working photosensitive layer and the photoconductive layer are provided in this order as separate layers on the electroconductive support, an interlayer having an electroconductivity may be provided on the positive working photosensitive layer, and specific examples thereof include a water-soluble resin as described in JP-B-1-57783.

The photoconductive compound used in the photoconductive layer of the present invention is preferably used in the form of a dispersion or solution in a binder resin. Also, when the photoconductive compound is a compound insoluble in a solvent such as a pigment, the compound is used after dispersing in a particle diameter of 5 μm or less by a dispersing machine such as a ball mill, a paint shaker, a dynomil and an attritor. The binder resin used in the photoconductive layer, and other additives may be added thereto during or after dispersion of the pigment. It is preferred that the photoconductive compound used does not absorb the light of wavelength absorbed by the positive working photosensitive composition, or, when the positive working photosensitive layer is present under the photoconductive layer, the photoconductive layer is made as thin as possible thereby increasing an amount of transmitted light.

The lithographic printing original plate according to the present invention can be obtained by coating a photosensitive layer on, for example, an aluminum substrate according to a conventional procedure. A coating solution can be prepared by dissolving each of the components constituting the photosensitive layer in an appropriate solvent. When a solvent-insoluble component such as a pigment is used, the component is used after dispersing in a particle diameter of 5 µm or less by a dispersing machine such as a ball mill, a paint shaker, a dynomil and an attritor. The binder resin and other additives used in the photosensitive layer can be added during or after the dispersion of the pigment. The coating solution thus prepared can be coated by a conventional coating method such as rotating coating, blade coating, knife coating, reverse-roll coating, dip-coating, rod-bar coating and spray coating methods on a substrate, followed by drying to obtain a printing original plate for electrophotographic plate-making.

Examples of solvents used for preparing a coating solution includes halogenated hydrocarbons such as dichloromethane, dichloroethane and chloroform, alcohols such as methanol and ethanol, ketones such as acetone, methyl ethyl ketone and cyclohexanone, glycol ethers such as ethylene glycol monomethyl ether and ethylene glycol monoethyl ether, ethers such as tetrahydrofuran and dioxane, esters such as ethyl acetate and butyl acetate, 1-methoxy-2-propanol, 1-methoxy-2-propyl acetate, N,N-dimethylacetamide, N,N-dimethylformamide, tetramethylurea, N-methylpyrrolidone, dimethyl sulfoxide, sulforan, γ-butyrolactone, toluene and dioxane. These solvents can be used singly or in an admixture thereof.

The photosensitive layer containing the positive working photosensitive composition coated as described above is then dried at a temperature of from 40° to 150° C. for a period of from 30 seconds to 10 minutes using a hot air dryer, an infrared dryer and the like.

The crosslinking between the component (a) and the component (b) can be achieved by a method for applying heat during the coating or drying of the photosensitive composition or a method for applying heat after coating and drying. The heating is preferably conducted at a temperature of from 60 to 150° C., more preferably from 80° to 130° C., for from 5 seconds to 20 minutes, preferably from 20 seconds to 5 minutes.

Various supports can be used as an electroconductive support of the lithographic printing plate according to the present invention. For example, electroconductive substrates having a hydrophilic surface including a plastic sheet having an electroconductive surface or, in particular, a paper which has been made solvent-impermeable and electroconductive, or an aluminum plate, a zinc plate, bimetal plates such as a copper-aluminum plate, a copper-stainless steel plate and a chromium-copper plate, trimetal plates such as chromium-copper-aluminum plate, a chromium-lead-iron plate and a chromium-copper-stainless steel plate, may be used. The thickness of these substrates is preferably from 0.1 to 3 mm, more preferably from 0.1 to 0.5 mm. Of these substrates, an aluminum plate is suitably used.

The aluminum plate used in the lithographic printing plate according to the present invention is a plate-like material of pure aluminum comprising aluminum as a main component or an aluminum alloy containing small amounts of heteroatoms in which the composition thereof is not specified, and conventionally known materials can be appropriately used. The aluminum plate can be used after it is grained and anodically oxidized by conventional methods. Prior to the graining treatment, an aluminum plate is subjected, if desired, to a degreasing treatment with a surfactant or an aqueous alkaline solution to eluting rolling mill grease on the surface of the aluminum plate, and then the aluminum plate is subjected to the graining treatment. The graining treatment include a method for mechanically roughening the surface, a method for electrochemically dissolving the surface, and a method for chemically selectively dissolving the surface. The method for mechanically roughening the surface can be performed by known methods which are so-called ball graining, brush graining, blast graining and buff-graining methods. Also, the electrochemical roughening method include a method conducted with an alternate or direct electric current in an electrolyte of hydrochloric acid or nitric acid. A combination of the both methods as described in JP-A-54-63902 may be used.

The surface roughened aluminum plate can be subjected to an alkali eluting treatment and a neutralizing treatment, if desired. The thus-treated aluminum plate is subjected to an anodic oxidation treatment. Examples of electrolytes used for the anodic oxidation treatment include sulfuric acid, phosphoric acid, oxalic acid, chromic acid or a mixed acid thereof, and the type of the electrolytes and the concentration thereof are appropriately determined depending upon the electrolyte used. Treatment conditions for the anodic oxidation vary widely depending upon the type of the electrolyte used and, therefore, can not be generally specified, but, in general, are suitably adjusted to an electrolyte concentration in the range of from 1 to 80% by weight, a liquid temperature in the range of from 5° to 70° C., an electric current density in the range of from 5 to 60 A/dm$^2$, a voltage in the range of from 1 to 100 V, and an electrolytic time in the range of from 10 seconds to 50 minutes. The amount of anodically oxidized film is suitable in the range of from 0.1 to 10 g/m$^2$, more preferably from 1 to 6 g/m$^2$. The thickness of aluminum plate is preferably from 0.1 to 3 mm, and more preferably from 0.1 to 0.5 mm.

Further, an aluminum plate which has been subjected to an immersion treatment in an aqueous solution of an alkali metal silicate after the anodic oxidation treatment as described in JP-B-47-5125 may be preferably used. Also, the electric deposition of a silicate as described in U.S. Pat. No. 3,658,662 is effective. The treatment with polyvinylsulfonic acid as described in West German Patent No. 1621478 is also suitable.

In the lithographic printing plate according to the present invention, if desired, an interlayer can be provided for the purpose of improving the adhesion of the above-described aluminum support and the photoconductive layer, electrical properties of the photoconductive layer, the eluting property and the printing characteristics. Also, if desired, an overcoat layer which can be eluted at the time of elution of the photoconductive layer can be provided on the photoconductive layer for the purpose of improving electrical properties of the photoconductive layer, image characteristics at the time of toner development and adhesion to the toner. The overcoat layer may be that is mechanically matted or may be a resin layer containing a matting agent. Specifically, various materials described in JP-A-4-304464 may be used.

The a toner which forms an image area in the present invention is to function as a mask during the whole surface exposure, and the toner is not necessarily required to have a resist property to an eluting solution hereinafter described. The toner which is preferably used in the toner development is desirably hydrophobic and ink-receptive and, for example, the following compound can be illustrated.

That is, examples of toner include resins such as acrylic resins using methacrylic acid, acrylic acid and esters thereof, vinyl acetate resins, copolymer resins of vinyl acetate and ethylene or vinyl chloride, vinyl chloride resins, vinylidene chloride resins, vinyl acetal resins such as polyvinyl butyral, polystyrene, copolymer resins of styrene and butadiene or methacrylates, polyethylene, polypropylene and chlorides thereof, polyester resins (for example, polyethylene terephthalate, polyethylene isophthalate, and polycarbonate of bisphenol A), phenol resins, xylene resins, alkyd resins, vinyl-modified alkyd resins, gelatin, cellulose ester derivatives such as carboxymethyl cellulose, waxes and polyolefins, but the toner is not restricted to these compounds. Further, the toner may be copolymers containing a charge controlling agent, for example, a metal salt of a fatty acid or a metal salt of naphthionic acid, a sulfonate, or a maleic half-amide component as described in JP-A-60-173558 and the charge controlling agent as described in JP-A-4-75695 in amounts which do not adversely affect the granularity and fixability of the toner.

The toner used in the present invention functions as a mask to active light during the whole surface exposure, and, therefore, is required to have a transmittance density of 0.6 or more which requires addition of a coloring agent or a light absorbent. Examples of the coloring agent include carbon black, nigrosin pigments, phthalocyanine blue, phthalocyanine green and benzidine yellow, and examples of the light absorbent include UV absorbents such as benzotriazole compounds, cinnamate compounds, aminoallylidenemalonitrile compound and benzophenone compounds.

As an eluting solution for removing the photosensitive layer in the toner non-image area after formation of the toner image, any solvent which is capable of removing the photosensitive layer may be used and is not specifically restricted, but, generally, an alkaline solvent is used. The alkaline solvent as referred to herein means an aqueous solution containing an alkaline compound, an organic solvent containing an alkaline compound or a mixture of an aqueous solution containing an alkaline compound and an organic solvent.

Examples of alkaline compounds include any organic and inorganic alkaline compounds such as sodium hydroxide, potassium hydroxide, sodium carbonate sodium silicate, potassium silicate, lithium silicate, sodium metasilicate, potassium metasilicate, sodium phosphate, potassium phosphate, ammonia and monoethanolamine, diethanolamine, triethanolamine, monoisopropanolamine, triisopropanolamine, diethylaminoethanol and 2-amino-2-methylpropanol.

Of these compounds, in particular, good etching property and printing characteristics can be obtained by incorporating a silicate represented by formula $mSiO_2/nM_2O$ (wherein M is an alkali metal atom, and m/n=0.5 to 8.5) into an eluting solution.

If desired, various organic solvents can be added to an eluting solution mainly comprising water. Preferred organic solvents include lower alcohols and aromatic alcohols such as methanol, ethanol, propanol, butanol, benzyl alcohol and phenethyl alcohol, polyhydric alcohols such as ethylene glycol, diethylene glycol, triethylene glycol and polyethylene glycol, ether alcohols, aminoalcohols, ether esters, ethers, ketones and esters, or surfactants, defoaming agents, and other various additives.

The present invention is further illustrated in greater detail by the following examples, but the present invention is not limited to these examples. Unless otherwise indicated, all percents, parts and the like are by weight.

EXAMPLE 1

A surface of a aluminum sheet according to JIS 1050 (the term "JIS" as used herein means "Japanese Industrial Standard") was grained with a rotating nylon brush using an aqueous suspension of pumice as an abrasion agent. The surface roughness (a center-line average roughness) at this time was 0.5 μm. After washing with water, the sheet was eluted by dipping in a 10% aqueous sodium hydroxide solution at 70° C. until aluminum was dissolved in an amount of 6 g/m². After washing with water, the sheet was neutralized by dipping in a 30% aqueous solution of nitric acid for 1 minute, followed by thoroughly washing with water. Then, the plate was subjected to an electrolytic roughening for 20 seconds using a square alternate wave having a voltage of 13 C at an anode and 6 V at a cathode (as described in JP-B-55-19191), and, after rinsing the surface by dipping in a 20% aqueous sulfuric acid solution at 50° C., the plate was washed with water. Further, the sheet was subjected to an anodic oxidation treatment in a 20% aqueous sulfuric acid until the weight of an anodically oxidized film became to be 3.0 g/m², followed by washing with water and drying to prepare a support.

Subsequently, a dispersion for forming a photosensitive layer having the following composition was dispersed uniformly by a high-speed dispersion mixer dinamil (a product of BACHOFEN CO., LTD., a tradename KDL-5) (a dispersion retention time: 2 hours), and coated on the support by a bar-coater, followed by drying at 120° C. for 10 minutes to prepare a printing original plate having a coating film thickness of 3.0 g/m².

(Dispersion for Forming Photosensitive Layer)

| | |
|---|---:|
| 1. X-type metal-free phthalocyanine Fastogen Blue 8120 (a product of Dainippon Ink & Chemicals Inc.) | 15 parts |
| 2. Copolymer of benzyl methacrylate/methacrylic acid/2-hydroxyethyl methacrylate = 60/20/20 (mol %) | 60 parts |
| 3. Vinyl ether compound of Compound No. II-11 | 12 parts |
| 4. Photo-acid generator of Compound No. XIII-8 | 3 parts |
| 5. 1-Methoxy-2-propanol | 240 parts |
| 6. Methyl ethyl ketone | 360 parts |

The resulting printing original plate was subjected to a uniform corona charging and, then, exposed to light from a halogen lamp for 5 seconds through a positive transparent original in an exposure amount of 6 lux on the plate surface. Then, the original plate was dipped in a liquid developer having a negative polarity (a product of Ricoh Co., Ltd., MRP-610) for 20 seconds and thereafter dried to obtain a positive toner image. Then, the plate precursor was exposed with a 2 KW high pressure mercury lamp at a distance of 50 cm.

After heating the exposed printing original plate at 120° C. for 5 minutes, it was dipped in the eluting solution (1) having the following composition for 10 seconds, 30 seconds or 60 seconds, and thereafter the photosensitive layer in the area where the toner image was not formed was eluted and removed by rubbing with a sponge while washing with water to form a printing plate. In the processing described above, a printing plate having a clear positive image area without any defects in the image area and a non-image area free from stains was obtained in each of the dipping times.

The results obtained are shown in Table 1 together with the results of Comparative Example 1.

Eluting Solution (1):

| | |
|---|---:|
| DP-4 (a product of Fuji Photo Film Co., a positive PS plate eluting solution) | 100 g |
| Monoethanolamine | 6 g |
| Benzyl alcohol | 8 g |
| Pelex NBL (a product of Kao Corp.) | 10 g |
| Water | 800 g |

Temperature of eluting solution: 25° C.

COMPARATIVE EXAMPLE 1

In the same manner as described in Example 1 except that a solution having the following composition was used for the dispersion for forming the photosensitive layer, a printing plate using a quinone azide compound as a photosensitive material was prepared. In the resulting plate, the removal of non-image area was not sufficient and stains occurred during the printing. Accordingly, a comparative printing plate was prepared by changing the time of whole surface exposure from 20 seconds to 60 seconds and changing the dipping time in the same manner as in Example 1. The results obtained are shown in Table 1.

It is understood from Table 1 that the printing plate according to the present invention shows no dependency on the eluting time and has a broad latitude as compared with the printing plate of Comparative Example 1. Also, it is understood that the printing plate according to the present invention provides a good image even when the time of whole surface exposure is short. That is, in the printing plate of Comparative Example 1, printing stains occur with a short exposure time and, hence, the time of whole surface exposure must be prolonged and, thus, the plate is disadvantageous from the standpoint of production efficiency.

(Comparative Dispersion for Forming Photosensitive Layer)

| 1. X-type metal-free phthalocyanine Fastogen Blue 8120 (a product of Dai-Nippon Ink Corp.) | 15 parts |
| --- | --- |
| 2. o-Naphthoquinonediazide-5-sulfonic acid ester obtained from condensate of acetone and pyrogallol | 10 parts |
| 3. Novolak-type phenol formaldehyde resin | 60 parts |
| 4. 1-Methoxy-2-propanol | 240 parts |
| 5. Methyl ethyl ketone | 360 parts |

TABLE 1

| | Dipping Time | | |
| --- | --- | --- | --- |
| | 10 seconds | 30 seconds | 60 seconds |
| Example 1: | | | |
| Image Area | No defect in image area | No defect in image area | No defect in image area |
| Non-image Area | No stain | No stain | No stain |
| Comparative Example 1: | | | |
| Image area | No defect in image area | Defect of small dots | Elution of image on whole surface |
| Non-image area | No stain | No stain | No stain |

EXAMPLE 2

An aluminum support having a surface roughness of 0.25 μm was prepared by subjecting an aluminum sheet to the graining with a nylon brush, the nitric acid electric field abrasion, the desmut treatment with a 3% aqueous sodium hydrogensulfate solution and the anodic oxidation in the same manner as described in Example 1, and, thereafter, further subjecting the aluminum sheet to a silicate treatment (as described in JP-B-47-5125), followed by washing with water and drying.

Subsequently, a printing original plate having a coating film thickness of 2.0 g/m² was prepared in the same manner as described in Example 1, except that the dispersion of a photoconductive compound having the following composition was dispersed uniformly by a high speed dispersing blender Dynamil (a dispersing retention time: 2 hours) and, thereafter, a positive working photosensitive solution having the following composition was added thereto to prepare a coating solution for forming a photosensitive layer.

(Dispersion of Photoconductive Compound)

| 1. X-type metal-free phthalocyanine Fastogen Blue 8120 (a product of Dai-Nippon Ink Corp.) | 10 parts |
| --- | --- |
| 2. N-(3,4-dichlorophenyl)-N'-(4-ethoxycarbonylphenyl)urea | 2 parts |
| 3. 1-Methoxy-2-propanol | 120 parts |
| 4. Methyl ethyl ketone | 180 parts |
| (Positive Working Photosensitive Solution) | |
| 1. Copolymer of benzyl methacrylate/methacrylic acid/2-hydroxyethyl methacrylate = 60/20/20 (mol %) | 60 parts |
| 2. Vinyl ether compound of Compound No. II-11 | 12 parts |
| 3. Photo-acid generator of Compound No. XIII-8 | 3 parts |
| 4. 1-Methoxy-2-propanol | 100 parts |
| 5. Methyl ethyl ketone | 100 parts |

Then, a positive toner image was obtained in the same manner as described in Example 1, except that a negative polar liquid developer (as described in JP-A-61-292645) was used for the above-described printing original plate. After exposing the original plate with a metal halide lamp for 20 seconds in an exposure amount of 8 mW/cm² on the plate surface, the original plate was heated at 120° C. for 5 minutes.

Then, the plate was dipped in an eluting solution (2) for 20 seconds and the photosensitive layer where no toner image was formed was eluted and removed by rubbing with a sponge while washing with water to form a printing plate whereby a good printing plate having a clear positive image area and a non-image area free from stains was obtained. When the resulting printing plate was used for printing on a sprint printing machine, 50,000 or more of good prints having no printing stains were obtained.

Further, in order to confirm the effect of the crosslinking in the photosensitive layer by heat during the drying, the resulting lithographic printing plate was dipped in the eluting solution (2) and each of the solvents of methyl ethyl ketone and dioxane for 5 minutes and, after washing with water, dissolving conditions of the coated film were observed. As a result, it was confirmed that the image area was not dissolved and stable image was obtained. The results obtained are shown in Table 2 together with the results of Comparative Example 2.

(Liquid Developer)

| Carbon black (a product of Mitsubishi Kasei Corp., #40) | 10 parts |
| --- | --- |
| Stearyl methacrylate/methyl methacrylate Copolymer (1:9 molar ratio) | 20 parts |
| Solprene 1205 (5 wt % Isopar H solution) | 200 parts |
| Isopar G (a product of Exxon Co.) | 200 parts |
| Compound of the following structure | 3 parts |

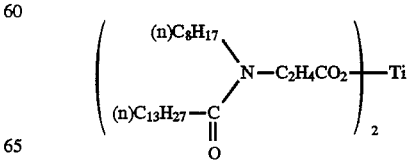

Eluting Solution (2):
Aqueous diluted solution of DN-3C* (DN-3C/H$_2$O=1/1), pH=9.2

*: DN-3C (a product of Fuji Photo Film Co., a negative PS plate eluting solution)

Eluting solution temperature: 30° C.

COMPARATIVE EXAMPLE 2

A printing plate was formed by the liquid development, the whole surface exposure, and the removal of non-image area with Eluting Solution (2) in the same manner as described in Example 2 but using a printing original plate prepared from the dispersion of Comparative Example 1. (There was no post-heating step.)

COMPARATIVE EXAMPLE 3

A comparative printing plate was formed in the same manner as described in Example 2, except for excluding the photo-acid generator (XIII-8) from composition of the positive working photosensitive solution composition in Example 2.

COMPARATIVE EXAMPLE 4

A comparative printing plate was formed in the same manner as described in Example 2, except for eliminating the vinyl ether compound (II-11) from the composition of the positive working photosensitive solution in Example 2.

The printing plates obtained in Comparative Examples 2 to 4 were evaluated for the dissolution in each of solvents and the image characteristics in the same manner as described in Example 2. The results obtained are shown in Table 2.

From the comparison of the results of Example 2 and Comparative Example 3 (containing a crosslinking component and lacking a photo-acid generator only) with Comparative Example 2 (containing no crosslinking components) and Comparative Example 4 (no vinyl ether group as a crosslinking component), it is understood that, in the printing plate according to the present invention, a solvent resistance in the image area corresponding to an unexposed area is markedly improved by thermal crosslinking of a compound containing a vinyl ether group and a linear polymer having an acid group and/or hydroxy group. Also, in image characteristics, it is necessary that the exposed area is solubilized with light, but in Comparative Example 3, the exposed area is not dissolved at all due to the absence of a photo-acid generator and no image is formed, and in Comparative Example 4, the unexposed area (i.e., the image area) is soluble due to the absence of a crosslinking component and no image is formed at all. On the other hand, in the printing plates according to the present invention, it is understood that the crosslinked structure in the exposed area is decomposed by the acid generated by light and the solubility thereof in an eluting solution is improved, and, as a result, a clear positive image can be obtained. Also, it is understood that, in the photosensitive layer using o-quinonediazide compound in Comparative Examples 1 and 2, the printing image is formed by the exposure solubility difference and, thus, the image formation is highly depended on the composition of eluting solution and the eluting time. On the other hand, in the printing plates of Examples 1 and 2 according to the present invention, since the image area is insoluble in the eluting solution due to the use of crosslinking structure in the polymer and yet the exposed area is easily dissolved-out, it is understood that the above-described dependency on the composition of the eluting solution and the elution time is markedly low, and, hence, the elution latitude is broad.

TABLE 2

| | Solubility of Dried Coating Film | | | |
|---|---|---|---|---|
| | Eluting Solution (2) | MEK | Dioxane | Image Characteristics |
| Example 2 | insoluble | insoluble | insoluble | clear positive image |
| Comparative Example 2 | soluble | soluble | soluble | exposed area partially dissolved |
| Comparative Example 3 | insoluble | insoluble | insoluble | both exposed and unexposed areas undissolved |
| Comparative Example 4 | soluble | soluble | soluble | both exposed and unexposed areas dissolved |

EXAMPLES 3 TO 22

Each of the lithographic printing plates was prepared in the same manner as described in Example 2, except for using a positive working photosensitive solution shown in Table 3. Each of the resulting printing plates showed good reproducibility of from 2 to 98% in the dot reproduction of 150 lines, and also good printing plates having no stains in the non-image area were obtained. When printing was conducted in a sprint printing machine using the above printing plates, 50,000 or more of good prints having no printing stains were obtained.

TABLE 3

| Example | Linear Polymer | Vinyl Ether Compound | Photo-acid Generator |
|---|---|---|---|
| 3 | P-1 | II-11 | XIII-8 |
| 4 | P-2 | II-11 | XIII-8 |
| 5 | P-3 | II-11 | XIII-8 |
| 6 | P-4 | II-11 | XIII-8 |
| 7 | P-5 | II-11 | XIII-8 |
| 8 | P-6 | II-11 | XIII-8 |
| 8 | P-7 | II-11 | XIII-8 |
| 10 | P-8 | II-11 | XIII-8 |
| 11 | P-9 | II-11 | XIII-8 |
| 12 | P-10 | II-11 | XIII-8 |
| 13 | P-11 | II-11 | XIII-8 |
| 14 | P-12 | II-11 | XIII-8 |
| 15 | P-14 | II-11 | XIII-8 |
| 16 | P-15 | II-11 | XIII-8 |
| 17 | P-13 | II-9 | XIII-7 |
| 18 | P-13 | II-35 | XII-5 |
| 19 | P-13 | II-4 | XI-3 |
| 20 | P-13 | X-3 | XII-8 |
| 21 | P-13 | X-6 | XI-7 |

TABLE 3-continued

| Example | Linear Polymer | Vinyl Ether Compound | Photo-acid Generator |
|---|---|---|---|
| 22 | P-13 | II-11 | XI-7 |

P-1: Methacrylic acid/methyl methacrylate/ethyl acrylate = 20/55/25 (mol %); a molecular weight Mw = 43,000
P-2: Acrylic acid/methyl methacrylate/ethyl acrylate = 20/60/20 (mol %); a molecular weight Mw = 48,000
P-3: Methacrylic acid/benzyl methacrylate = 30/70 (mol %); a molecular weight Mw = 23,000
P-4: Acrylic acid/benzyl methacrylate = 30/70 (mol %); a molecular weight Mw = 29,000
P-5: Acrylic acid/benzyl methacrylate/2-hydroxyethy methacrylate = 30/60/10 (mol %); a molecular weight Mw = 29,000
P-6: Itaconic acid/benzyl methacrylate/2-hydroxyethyl methacrylate = 10/70/20 (mol %); a molecular weight Mw = 29,000
P-7: Methacrylic acid/benzyl methacrylate/2-hydroxyethyl methacrylate/2,3-dihydroxypropyl methacrylate = 20/50/20/10 (mol %); a molecular weight Mw = 29,000
P-8: Acrylic acid/benzyl methacrylate/hexyl methacrylate/2-hydroxyethyl methacrylate = 20/50/10/20 (mol %); a molecular weight Mw = 35,000
P-9: Acrylic acid/benzyl methacrylate/benzyl acrylate/2-hydroxyethyl methacrylate = 30/50/10/10 (mol %); a molecular weight Mw = 30,000
P-10: Vinyl benzoate/methyl methacrylate/ethyl acrylate = 20/60/20 (mol %); a molecular weight Mw = 37,000
P-11: Acrylic acid/benzyl methacrylate/2-hydroxystyrene = 20/60/20 (mol %); a molecular weight Mw = 28,000
P-12: Acrylic acid/hexyl methacrylate/2-hydroxyethyl methacrylate = 30/50/20 (mol %); a molecular weight Mw = 31,000
P-13: Methacrylic acid/benzyl methacrylate/2-hydroxyethyl methacrylate = 50/30/20 (mol %); a molecular weight Mw = 37,000
P-14: Polymer represented by Formula (a); a molecular weight Mw = 30,000
P-1: Polyurethane resin obtained by reaction at the ratio shown in Formula (b); a molecular weight Mw = 38,000
(Ka 25)

Formula (a):

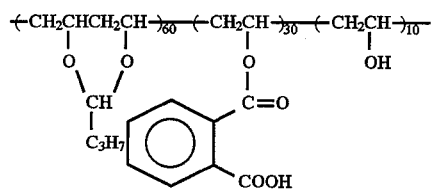

Formula (b):

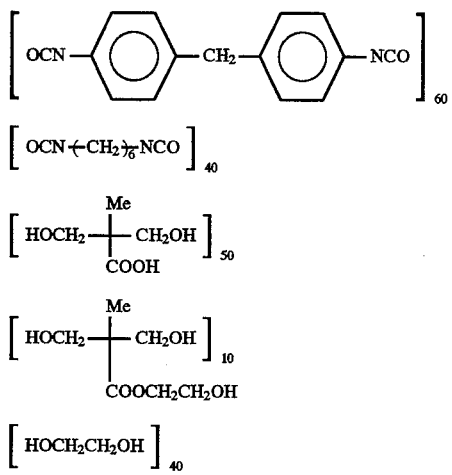

EXAMPLE 23

In this example, a layer containing a positive working photosensitive composition was formed on an electroconductive and hydrophilic support and, thereafter, a photoconductive layer containing a photoconductive compound was provided in this order.

More specifically, the graining with a nylon brush, the nitric acid electric field abrasion and the anodic oxidation were carried out in the same manner as described in Example 1 to prepare an aluminum support having a surface roughness (a center-line average roughness) of 0.50 μm.

Subsequently, a photosensitive solution for forming a positive working photosensitive layer having the following composition was coated by a bar coater in a coating amount of 1.7 g/m², followed by drying at 120° C. for 10 minutes. (Photosensitive Solution for Forming Positive Working Photosensitive Layer)

| | |
|---|---|
| 1. Copolymer of benzyl methacrylate/methacrylic acid/2-hydroxyethyl methacrylate = 60/20/20 (mol %) | 60 parts |
| 2. Vinyl ether compound of Compound No. II-11 | 12 parts |
| 3. Photo-acid generator of Compound No. XIII-8 | 3 parts |
| 4. 1-Methoxy-2-propanol | 240 parts |
| 5. Methyl ethyl ketone | 360 parts |

On the thus-obtained positive working photosensitive layer, an aqueous polyvinyl alcohol solution (a product of Wako Pure Chemical Industries, Ltd.; a degree of polymerization: about 500) was coated to form an interlayer having a thickness of 0.3 μm. Further, after preparing a dispersion of a photoconductive compound having the following composition by dispersing uniformly in a high speed dispersing blending machine Dynamil (dispersing retention time: 2 hours), the resulting dispersion was coated by a bar coater in a coating amount of 2.0 g/m², followed by drying.
(Dispersion of Photoconductive Compound)

| | |
|---|---|
| 1. X-type metal-free phthalocyanine Fastogen Blue 8120 (a product of Dai-Nippon Ink Corp.) | 10 parts |
| 2. Copolymer of benzyl methacrylate/methacrylic acid = 60/40 (mol %); a molecular weight Mw = 31,000 | 50 parts |
| 3. Diphenylaminobenzaldehyde-N,N'-diphenylhydrazine | 2 parts |
| 4. N,N'-Diethylbenzylidene thiobarbiturate | 1 part |
| 5. 1-Methoxy-2-propanol | 120 parts |
| 6. Methyl ethyl ketone | 180 parts |

The printing original plate obtained as above was treated with a negative polar liquid developer in the same manner as described in Example 2 to obtain a positive toner image, subjected to the whole surface exposure with a metal halide lamp, and, after heating at 120° C. for 5 minutes, dipped in Eluting Solution (2) for 20 seconds. The photosensitive layer where the toner image was not formed was eluted and removed by rubbing with a sponge while washing with water to form a printing plate. The resulting printing plate showed good reproducibility of from 2 to 98% in the dot reproduction of 150 lines, and also a good printing plate having no stains in the non-image area was obtained. When printing was conducted in a sprint printing machine using the above printing plate, 50,000 or more of good prints having no printing stains were obtained.

While the invention has been described in detail and with reference to specific embodiments thereof, it will be apparent to one skilled in the art that various changes and modifications can be made therein without departing from the spirit and scope thereof.

What is claimed is:

1. A lithographic printing plate formed by charging a printing original plate which comprises an electroconductive support having a hydrophilic surface and provided thereon at least one photosensitive layer containing a photoconductive compound and a positive working photosensitive composition in the same layer or different layers, imagewise exposing the printing original plate to form a latent image, forming a toner image with a liquid developer, exposing the whole surface of the positive working photosensitive composition with an active light, and removing the photosensitive layer in a non-image area other than the toner image area with an eluting solution comprising an alkaline solvent, wherein said positive working photosensitive composition contains:

(a) a compound having at least two enol ether groups represented by formula (I):

$$(R^2)(R^1)C=C(R^3)-O- \qquad (I)$$

wherein $R^1$, $R^2$ and $R^3$, which may be the same or different, each represents hydrogen atom, an alkyl group or an aryl group and any two of $R^1$, $R^2$ and $R^3$ may be bonded together to form a saturated or an olefinic unsaturated ring, (b) a linear polymer having at least one of an acid group or a hydroxy group and a (meth)acrylic acid ester as a copolymerizable monomer, and (c) a compound which generates an acid by decomposition upon irradiation with active light, and wherein the component (a) and the component (b) are thermally crosslinked during or after formation of the photosensitive layer.

2. The lithographic printing plate as claimed in claim 1, wherein said compound of the component (a) is a vinyl ether compound represented by the following formula (II) or (III):

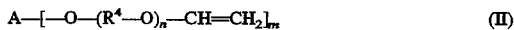
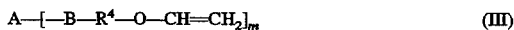

$$A-[-O-(R^4-O)_n-CH=CH_2]_m \qquad (II)$$

$$A-[-B-R^4-O-CH=CH_2]_m \qquad (III)$$

wherein A represents an m-valent polyvalent chain-form hydrocarbon linking group, polyvalent aromatic hydrocarbon linking group, polyvalent heterocyclic linking group, or linking group which is a polyarylalkane from which hydrogen atoms of m numbers have been removed; B represents —COO—, —NHCOO— or —NHCONH—; $R^4$ represents a straight-chain or branched alkylene group having from 1 to 10 carbon atoms; n is 0 or an integer of from 1 to 10; and m represents an integer of from 2 to 6.

3. The lithographic printing plate as claimed in claim 2, wherein said vinyl ether compound is contained in said positive working photosensitive composition in an amount of from 1 to 80% by weight based on the total solid content of the positive working photosensitive composition.

4. The lithographic printing plate as claimed in claim 1, wherein said linear polymer is contained in said positive working photosensitive composition in an amount of from 1 to 95% by weight based on the total solid content of the positive working photosensitive composition.

5. The lithographic printing plate as claimed in claim 1, wherein said compound which generates an acid is contained in said positive working photosensitive composition in an amount of from 0.001 to 40% by weight based on the total solid content of the positive working photosensitive composition.

6. The lithographic printing plate as claimed in claim 1, wherein said photosensitive layer comprises at least two layers, one of the photosensitive layers containing said photoconductive compound, and at least one of the other photosensitive layers containing said positive working photosensitive composition.

7. The lithographic printing plate as claimed in claim 1, wherein the ester moiety of the (meth)acrylic acid ester has an ester moiety which is a straight or branched alkyl group having 1 to 18 carbon atoms or a group having an aromatic ring.

* * * * *